US012784808B2

(12) United States Patent
Oh

(10) Patent No.: US 12,784,808 B2
(45) Date of Patent: Nov. 3, 2026

(54) MEMORY CONTROLLER PERFORMING TRAINING AND OPERATION METHOD THEREOF

(71) Applicant: SAMSUNG ELECTRONICS CO., LTD., Suwon-si (KR)

(72) Inventor: Jihun Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 18/887,624

(22) Filed: Sep. 17, 2024

(65) Prior Publication Data

US 2025/0246227 A1 Jul. 31, 2025

(30) Foreign Application Priority Data

Jan. 26, 2024 (KR) ........................ 10-2024-0012661

(51) Int. Cl.
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC ............ G11C 11/4076; G11C 11/4096; G11C 29/12015; G11C 7/1093; G11C 7/222; G11C 2029/3602; G11C 29/023; G11C 2207/2254; G11C 29/028; G11C 16/30; G11C 7/06; G11C 16/32; G06F 3/061; G06F 3/0658; H03K 5/1565
See application file for complete search history.

(56) References Cited

U.S. PATENT DOCUMENTS

| | | | | |
|---|---|---|---|---|
| 6,874,097 | B1 * | 3/2005 | Aliahmad | G06F 1/10 713/401 |
| 10,712,770 | B1 | 7/2020 | Chiang et al. | |
| 10,734,983 | B1 * | 8/2020 | Jeter | G11C 11/409 |
| 11,437,085 | B2 | 9/2022 | Choi et al. | |
| 2020/0133505 | A1 | 4/2020 | Kim | |
| 2020/0258557 | A1 | 8/2020 | Giovannini et al. | |
| 2023/0029968 | A1 | 2/2023 | Chang et al. | |
| 2023/0035176 | A1 | 2/2023 | Jeong et al. | |
| 2023/0057238 | A1 | 2/2023 | Kang | |
| 2023/0147016 | A1 | 5/2023 | Kim et al. | |
| 2023/0360689 | A1 * | 11/2023 | Park | G11C 11/4076 |
| 2023/0386600 | A1 * | 11/2023 | Lee | G11C 29/52 |
| 2025/0077113 | A1 * | 3/2025 | Aquil | G06F 3/061 |

* cited by examiner

*Primary Examiner* — Zhuo H Li
(74) *Attorney, Agent, or Firm* — Sughrue Mion, PLLC

(57) ABSTRACT

The memory controller includes a multi-phase clock generator generating first to N-th clocks having N different phases, a write clock generator generating monitoring signals having a logic state corresponding to bits of the data pattern, a duty adjuster adjusting duties of the first to N-th clocks, a skew adjuster adjusting a skew of at least one of the first to N-th clocks, and a training circuit controlling a training operation for adjusting the duties and skews of the first to N-th clocks, wherein, during a first training process of adjusting the duties of the first to N-th clocks, first to N-th monitoring signals having waveforms corresponding to the first to N-th clocks are generated using data patterns having different values, and the duty of each of the first to N-th clocks is adjusted based on a result of monitoring each of duties of the first to N-th monitoring signals.

20 Claims, 24 Drawing Sheets

MEMORY CONTROLLER PERFORMING TRAINING AND OPERATION METHOD THEREOF

CROSS-REFERENCE TO RELATED APPLICATION

This application is based on and claims priority under 35 U.S.C. § 119 to Korean Patent Application No. 10-2024-0012661, filed on Jan. 26, 2024, in the Korean Intellectual Property Office, the disclosure of which is herein incorporated by reference in its entirety.

BACKGROUND

One or more example embodiments of the disclosure relate to a memory controller, and more particularly, to a memory controller that performs training on various clocks and data and a method of operating the memory controller.

Memory controllers or systems on chips (SoCs) including the memory controllers may communicate with memory devices via high-speed interfaces. For example, an SoC may include an integrated circuit in which a plurality of components of an electronic system or a plurality of intellectual properties (IPs) are integrated and may perform training on a memory device before communicating with the memory device. For example, the SoC may perform various types of training operations, such as ZQ calibration, reference voltage training, data training, and clock signal training.

Also, a serializer/deserializer (SERDES) operation is required for a high-speed operation of a memory interface, and multi-phase clock signals relating to the SERDES operation may be used. In this regard, when distortion occurs in duties and/or skews of the multi-phase clock signals generated inside the memory controller, a valid window margin for data transmission and reception is reduced, which causes a decrease in stability during the high-speed operation. According to the related art, a method of monitoring and adjusting duties of clock signals inside a memory device by a training operation has been proposed. However, as a correction to duty and/or skew distortion of multi-phase clock signals and data inside a memory controller is not properly performed, there is a limitation to improving the stability of a high-speed operation in a memory interface.

SUMMARY

One or more example embodiments of the disclosure provide a memory controller for adjusting duties and/or skews of multi-phase clock signals and data inside a memory controller by a training operation and a method of operating the memory controller.

According to an aspect of an example embodiment of the disclosure, there is provided a memory controller including a multi-phase clock generator configured to generate a first clock to an N-th clock having N different phases (where N is an integer equal to or greater than 2); a write clock generator configured to receive a data pattern and generate, in synchronization with edges of the first to N-th clocks, a monitoring signal having a logic state corresponding to bits of the data pattern during a training process; a duty adjuster configured to adjust duties of the first to N-th clocks based on pieces of duty control code that are set during the training process; a skew adjuster configured to adjust a skew of at least one of the first to N-th clocks based on skew control code that is set during the training process; and a training circuit configured to control a training operation for adjusting the duties and at least one skew of the first to N-th clocks, the training operation including a plurality of training processes including the training process, wherein, during a first training process of adjusting the duties of the first to N-th clocks, a first monitoring signal to an N-th monitoring signal respectively having waveforms corresponding to the first to N-th clocks are generated using data patterns having different values, and the duties of the first to N-th clocks are adjusted based on a result of monitoring duties of the first to N-th monitoring signals.

According to an aspect of an example embodiment of the disclosure, there is provided a method of operating a memory controller, the method including generating a first clock, a second clock, a third clock, and a fourth clock having phase differences of 90 degrees therebetween; generating monitoring signals corresponding to waveforms of the first to fourth clocks by sampling bits of a data pattern in synchronization with edges of the first to fourth clocks; transmitting the monitoring signals to a memory device; receiving, from the memory device, duty information representing a result of monitoring duties of the monitoring signals; and adjusting duties of the first to fourth clocks based on the duty information.

According to an aspect of an example embodiment of the disclosure, there is provided a method of operating a memory controller, the method including generating a first clock to an N-th clock having phase differences of 90 degrees therebetween (where N is an integer equal to or greater than 2); generating a first monitoring signal to an N-th monitoring signal corresponding to waveforms of the first to N-th clocks, based on the first to N-th clocks and data patterns; adjusting a duty of each of the first to N-th clocks, based on a result of monitoring duties of the first to N-th monitoring signals while changing the duties of the first to N-th clocks in a training process; adjusting a skew of at least one of the first to N-th clocks, based on a result of monitoring the duties of the first to N-th monitoring signals while changing the skew of at least one of the first to N-th clocks in the training process; writing first to N-th data in a memory device, while changing duties of the data, and receiving the first to N-th data from the memory device in synchronization with a write clock having a frequency twice that of each of the first to N-th clocks; and adjusting the duties of the data based on a comparison result between a valid window size of data received in synchronization with a rising edge of the write clock and a valid window size of data received in synchronization with a falling edge of the write clock.

BRIEF DESCRIPTION OF DRAWINGS

Example embodiments will be more clearly understood from the following detailed description taken in conjunction with the accompanying drawings in which:

FIGS. 9 to 11A and 11B are diagrams showing an example of a training process of adjusting skews of multi-phase clock signals according to one or more example embodiments;

DETAILED DESCRIPTION

Hereinafter, example embodiments are described in detail with reference to the accompanying drawings.

Figure 1:
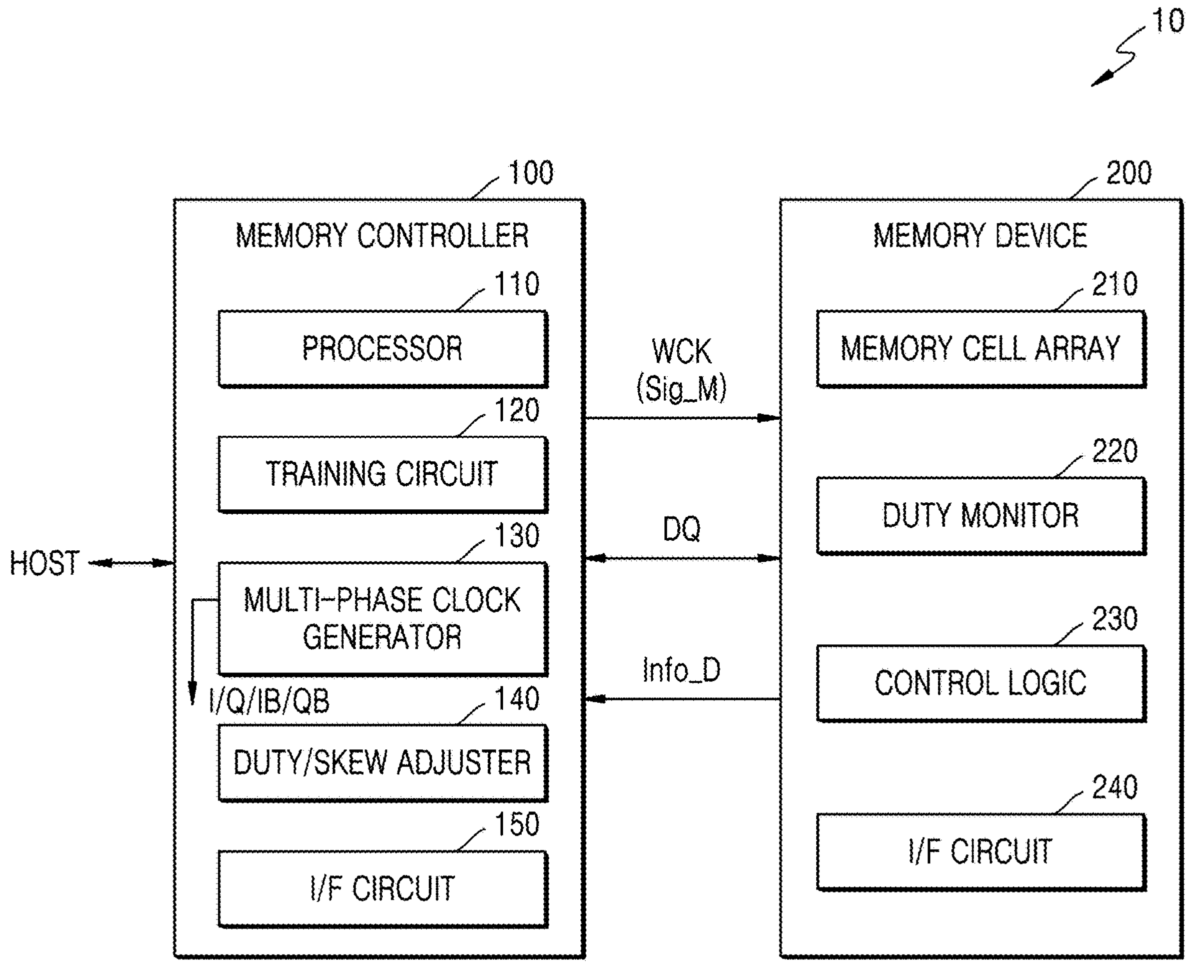
FIG. 1 is a block diagram showing a memory system including a memory controller according to one or more example embodiments.

FIG. 1 is a block diagram showing a memory system 10 including a memory controller 100 according to one or more example embodiments.

Referring to FIG. 1, the memory system 10 may include the memory controller 100 and a memory device 200. The memory system 10 may be included in a personal computer (PC), a mobile electronic device, or a data server. The mobile electronic device may include, for example but not limited to, a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, a drone, and/or the like.

The memory controller 100 may be provided as an integrated circuit (IC), a system-on-chip (SoC), an application processor (AP), a mobile AP, a chip set, or a set of chips or may be included therein. The memory controller 100 may include a semiconductor device that performs a memory control function. For example, when the memory controller 100 corresponds to an AP, the memory controller 100 may include a memory control logic (not shown), a random-access memory (RAM), a central processing unit (CPU), a graphics processing unit (GPU), and/or a modem.

The memory controller 100 may control the memory device 200 to read data DQ (or referred to as read data DQ) stored in the memory device 200 and/or write data DQ (or referred to as write data DQ) on the memory device 200 in response to a write/read request from a host HOST. Specifically, the memory controller 100 may control write and read operations of the data DQ with respect to the memory device 200 by providing an address and a command to the memory device 200. In addition, the write data DQ and the read data DQ may be transmitted and received between the memory controller 100 and the memory device 200.

The memory controller 100 may access the memory device 200 in response to a request from the host HOST and communicate with the host HOST using a variety of protocols. For example, the memory controller 100 may communicate with the host HOST using an interface protocol, such as peripheral component interconnect-express (PCI-E), advanced technology attachment (ATA), serial ATA (SATA), parallel ATA (PATA), and serial attached SCSI (SAS). In addition, various other interface protocols, such as universal serial bus (USB), multi-media card (MMC), enhanced small disk interface (ESDI), and integrated drive electronics (IDE), may be applied to protocols between the host HOST and the memory controller 100.

The memory device 200 may include a volatile memory device. The volatile memory device may be formed as an RAM, a dynamic RAM (DRAM), or a static RAM (SRAM), but the embodiment is not limited thereto. For example, the memory device 200 may include a double data rate synchronous dynamic random access memory (DDR SDRAM), a low power double data rate (LPDDR) SDRAM, a graphics double data rate (GDDR) SDRAM, a rambus dynamic random access memory (RDRAM), etc. Also, the memory device 200 may include a high bandwidth memory (HBM). Also, the memory device 200 may include a non-volatile memory device. For example, the memory device 200 may include a resistive memory, such as a magnetic RAM (MRAM), a ferroelectric RAM (FeRAM), a phase change RAM (PRAM), a resistive RAM (ReRAM), etc.

Referring to FIG. 1, the memory controller 100 may include a processor 110, a training circuit 120, a multi-phase clock generator 130, a duty/skew adjuster 140, and a first interface circuit 150. The processor 110 may perform all controls related to memory operations, and the training circuit 120 may perform training operations on various signals and voltages related to the memory operations based on the controls by the processor 110. For example, when the memory system 10 is initially driven, the training circuit 120 may perform training on various clock signals used in the memory controller 100 and may also perform training on data provided to the memory device 200. In addition or alternatively, the training circuit 120 may perform one or more of skew training between a read data strobe signal and read data, training of read reference voltage for discrimination of read data, skew training between a write data strobe signal and write data, training of write reference voltage for discrimination of write data, etc.

Also, the memory device 200 may include a memory cell array 210, a duty monitor 220, a control logic 230, and a second interface circuit 240. When the memory device 200 includes a DRAM, the memory cell array 210 may include a plurality of DRAM cells.

The multi-phase clock generator 130 of the memory controller 100 may generate multi-phase clock signals based on a reference clock signal having an arbitrary frequency and may generate, for example, 4-phase clock signals with phase differences of 90 degrees therebetween. Various internal operations of the memory controller 100 may be performed in synchronization with the multi-phase clock signals and/or other clock signals generated therefrom. The multi-phase clock signals may have a low frequency compared to data output speed, and the memory controller 100 may transmit and receive data based on a clock signal having a relatively low frequency. Accordingly, the data may be stably transmitted and received.

The multi-phase clock signals generated from the multi-phase clock generator 130 may be transmitted to various circuit blocks via wires inside the memory controller 100. However, during the generation and transmission of the multi-phase clock signals, the duty and/or skew of each of the multi-phase clock signals may be distorted due to a clock transmission path, an offset of circuit blocks, or the like. Also, a distortion of the duty of data may occur during a process of transmitting data to the memory device 200. Accordingly, duty and/or skew correction for the multi-phase clock signals and data is required.

According to one or more example embodiments, the memory controller 100 may detect and adjust the duty/skew of multi-phase clock signals during a training process and may also detect and adjust the duty/skew of data. For example, the training operation may include training processes for setting duty control code and skew control code for various clock signals and data, and the training operation may be performed during an initial driving process as power is provided to the memory system 10 and/or may be performed at any point in time during a run-time.

The training operation according to one or more example embodiments is described below.

During the training process, the memory controller 100 may generate first to N-th clocks (N is an integer equal to or greater than 2) as a multi-phase clock signal and may also generate a write clock WCK defined in the LPDDRx specifications, such as LPDDR5 and LPDDR6, or the graphics DDR (GDDR) specifications. For example, the write clock WCK may be generated based on the first to N-th clocks and may include a signal having a frequency twice that of each of the first to N-th clocks. For example, assuming first to fourth clocks I, Q, IB, and QB as 4-phase clock signals, a rising edge of the write clock WCK may be synchronized with rising edges of the first and third clocks, and a falling edge of the write clock WCK may be synchronized with rising edges of the second and fourth clocks. The memory controller 100 may provide the write clock WCK to the memory device 200, and the memory device 200 may receive or transmit the data in synchronization with the write clock WCK. In addition, the memory controller 100 may receive the data output from the memory device 200 in synchronization with the write clock WCK.

In an embodiment, the write clock WCK may be used as a monitoring signal Sig_M during the training process, and the monitoring signal Sig_M may have various waveforms according to data patterns having various values. For example, the monitoring signal Sig_M having a waveform formed by sampling bits of a data pattern may be generated at edge timings of the first to fourth clocks I, Q, IB, and QB. Accordingly, if there is distortion in the duty or skew of the first to fourth clocks I, Q, IB, and QB, distorted characteristics may be reflected in the waveform of the monitoring signal Sig_M generated based on the first to fourth clocks I, Q, IB, and QB.

In an embodiment, the memory controller 100 may transmit the monitoring signal Sig_M to the memory device 200 and receive duty information Info_D according to a result of monitoring a duty for the monitoring signal Sig_M from the memory device 200. The memory controller 100 may adjust a duty and/or a skew of each of the first to fourth clocks I, Q, IB, and QB based on the received duty information Info_D.

In an embodiment, a value of the data pattern related to the generation of the monitoring signal Sig_M may change in various manners during the training process. Depending on the value of the data pattern, the monitoring signal Sig_M may have a waveform corresponding to one of the first to fourth clocks I, Q, IB, and QB or may have a waveform corresponding to the write clock WCK having a frequency twice that of each of the first to fourth clocks I, Q, IB, and QB. For example, the training process related to duty adjustment of the first to fourth clocks I, Q, IB, and QB may include a plurality of operations. In a first operation, the data pattern has a first value, and based on the first value of the data pattern, the monitoring signal Sig_M may have a waveform corresponding to the first clock I. The memory controller 100 may provide the monitoring signal Sig_M to the memory device 200 and adjust the duty of the first clock I based on the duty information Info_D provided from the memory device 200.

Similarly, for the duty adjustment of the first to fourth clocks I, Q, IB, and QB, the data pattern in a second operation may have a second value. The monitoring signal Sig_M may have a waveform corresponding to the second clock Q based on the second value of the data pattern, and the duty of the second clock Q may be adjusted based on the duty information Info_D. Also, the data pattern in a third operation may have a third value. The monitoring signal Sig_M may have a waveform corresponding to the third clock IB based on the third value of the data pattern, and the duty of the third clock IB may be adjusted based on the duty information Info_D. Also, the data pattern in a fourth operation may have a fourth value. The monitoring signal Sig_M may have a waveform corresponding to the fourth clock QB based on the fourth value of the data pattern, and the duty of the fourth clock QB may be adjusted based on the duty information Info_D.

Also, the training process related to skew adjustment of the first to fourth clocks I, Q, IB, and QB may include a plurality of operations. In a first operation, the monitoring signal Sig_M having a waveform corresponding to the first clock I and the monitoring signal Sig_M having a waveform corresponding to the third clock IB may be generated. For example, a section between edges of the first clock I and the third clock IB in the first operation may correspond to a logic high section or a logic low section of the monitoring signal Sig_M, and a skew between the first clock I and the third clock IB may be detected and adjusted based on the duty information Info_D about the monitoring signal Sig_M.

Also, in a second operation, the monitoring signal Sig_M having a waveform corresponding to the second clock Q and the monitoring signal Sig_M having a waveform corresponding to the fourth clock QB may be generated. For example, a section between edges of the second clock Q and the fourth clock QB in the second operation may correspond to a logic high section or a logic low section of the monitoring signal Sig_M, and a skew between the second clock Q and the fourth clock QB may be detected and adjusted based on the duty information Info_D about the monitoring signal Sig_M. Also, in a third operation, the monitoring signals Sig_M having a waveform corresponding to the write clock WCK and a waveform inverted therefrom may be generated. For example, a section between edges of the first clock I and the second clock Q in the third operation may correspond to a logic high section or a logic low section of the monitoring signal Sig_M, and a skew between the first clock I and the second clock Q may be detected and adjusted based on the duty information Info_D about the monitoring signal Sig_M. In addition, in the third operation, the skew between the third clock IB and the fourth clock QB may be detected and adjusted.

Through the training process described above, the duty and skew of each of the first to fourth clocks I, Q, IB, and QB may be adjusted. In addition, although not shown in FIG. 1, a data duty adjuster (not shown) that adjusts the duty of data may be provided in a path for transmitting the data in the memory controller 100, and the training process may further include a data duty training process of outputting and writing data to the memory device 200 and then adjusting the duty of the data based on a valid window size, which is determined based on the data read from the memory device 200. The training related to the data is described in detail in the following example embodiments.

According to one or more example embodiments, during the training process, the duty/skew of the multi-phase clock signals may be adjusted in the memory controller 100, and the duty/skew of the data may also be adjusted. Therefore, a sufficient valid window margin may be secured, and stability may be improved especially in a high-speed operation with the memory device 200.

Also, in the above-described embodiment, it has been described that the write clock WCK is used as the monitoring signal Sig_M according to the data pattern. However, the embodiments are not limited thereto. For example, the memory controller 100 may further include a circuit that generates a monitoring signal Sig_M separately from the write clock WCK. In addition, for a plurality of training processes in the training operation, the values of data patterns for generating monitoring signals Sig_M having various waveforms may be set and stored in the memory controller 100. Also, in describing the following example embodiments, the terms "write clock WCK" and "monitoring signal Sig_M" during the training process may be used interchangeably with the same meaning.

Figure 2A:
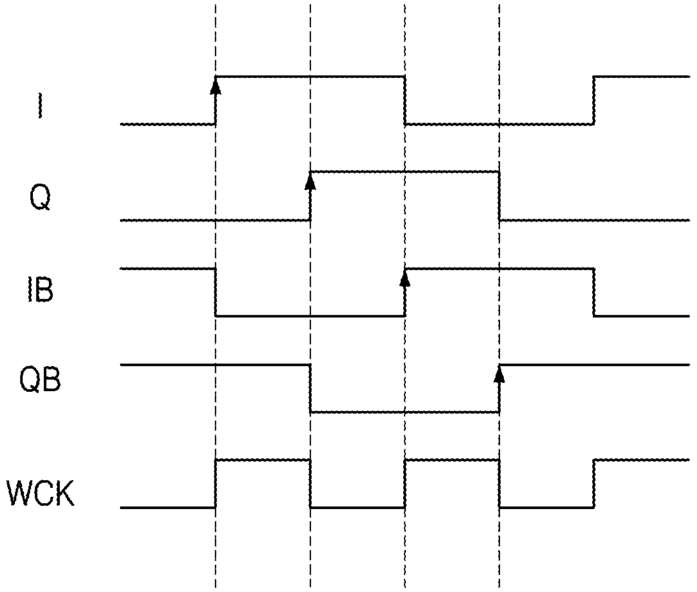
FIGS. 2A and 2B are waveform diagrams showing an example of 4-phase clock signals and a write clock.
Figure 2B:
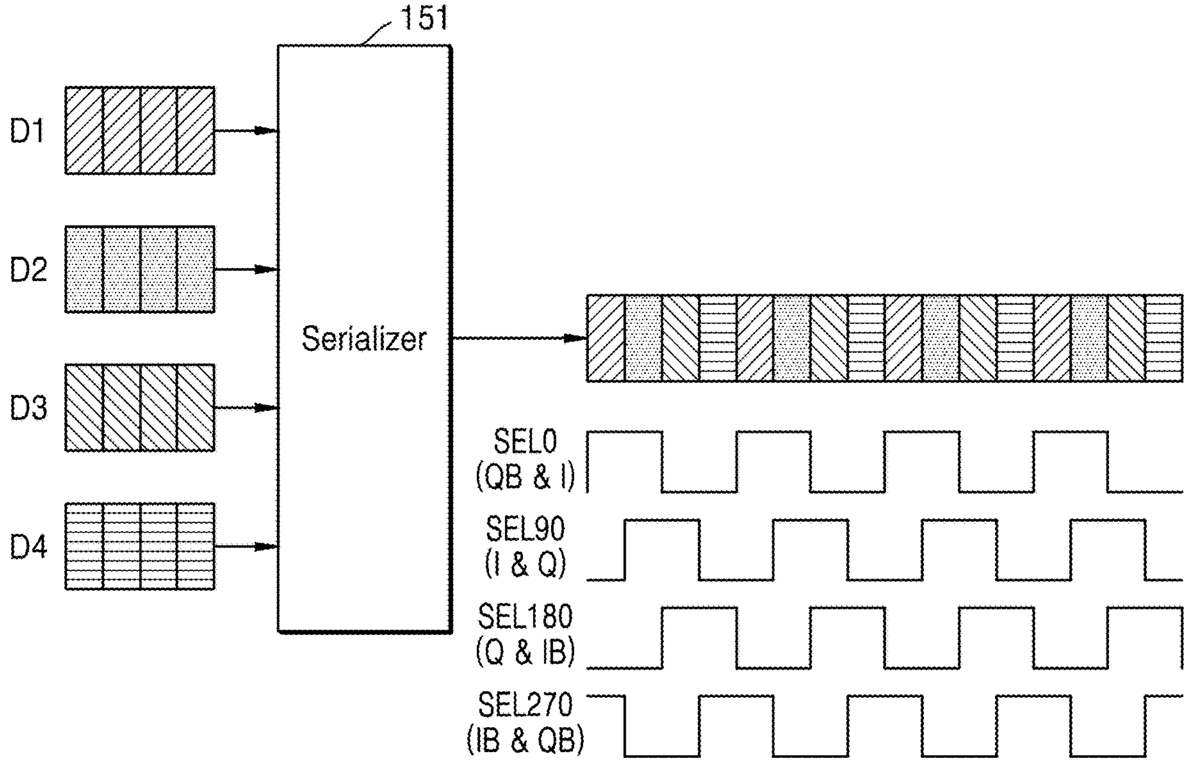

FIGS. 2A and 2B are waveform diagrams showing an example of 4-phase clock signals and a write clock. FIG. 2A illustrates a case in which a memory controller generates first to fourth clocks I, Q, IB, and QB and a write clock WCK is generated from the first to fourth clocks I, Q, IB, and QB. Also, FIG. 2B illustrates a case in which data is serialized based on the 4-phase clock signals.

Referring to FIGS. 1 and 2A and 2B, the first to fourth clocks I, Q, IB, and QB may sequentially have phase differences of 90 degrees therebetween. Also, the write clock WCK may be generated using the first to fourth clocks I, Q, IB, and QB. For example, the write clock WCK may have a logic high level in synchronization with the first and third clocks I and IB and may have a logic low level in synchronization with the second and fourth clocks Q and QB. Also, when the write clock WCK is used as the monitoring signal Sig_M during the training process, the write clock WCK has a logic level corresponding to the value of the data pattern in synchronization with the edges of the first to fourth clocks I, Q, IB, and QB. Accordingly, the monitoring signals Sig_M having various waveforms may be generated.

As described above, distortion may occur in the duty/skew of the first to fourth clocks I, Q, IB, and QB due to various factors in the memory controller 100, and this distortion generated in duty/skew may be reflected in the monitoring signal Sig_M. For example, the waveform of the monitoring signal Sig_M may be distorted due to the distortion of duty/skew generated in the first to fourth clocks I, Q, IB, and QB. According to the above-described embodiment, the duty/skew of the first to fourth clocks I, Q, IB, and QB may be corrected by monitoring the duty of the monitoring signal Sig_M based on the data patterns having various values.

FIG. 2B illustrates a case in which the memory controller 100 serializes and outputs first to fourth data D1 to D4. For example, the memory controller 100 may include a serializer 151, and the serializer 151 may be provided in the first interface circuit 150. The serializer 151 may sequentially output the first to fourth data D1 to D4 in synchronization with the first to fourth clocks I, Q, IB, and QB.

In an example operation, the serializer 151 may output the first to fourth data D1 to D4 based on selection signals generated using the first to fourth clocks I, Q, IB, and QB. For example, a first selection signal SEL0 may be generated using the fourth clock QB and the first clock I, and a rising edge of the first selection signal SEL0 may be synchronized with the first clock I. The serializer 151 may output the first data D1 in synchronization with the first selection signal SEL0.

A second selection signal SEL90 may be generated using the first clock I and the second clock Q, and the serializer 151 may output the second data D2 in synchronization with the second selection signal SEL90. A third selection signal SEL180 may be generated using the second clock Q and the third clock IB, and the serializer 151 may output the third data D3 in synchronization with the third selection signal SEL180. A fourth selection signal SEL270 may be generated using the third clock IB and the fourth clock QB, and the serializer 151 may output the fourth data D4 in synchronization with the fourth selection signal SEL270.

Figure 3:
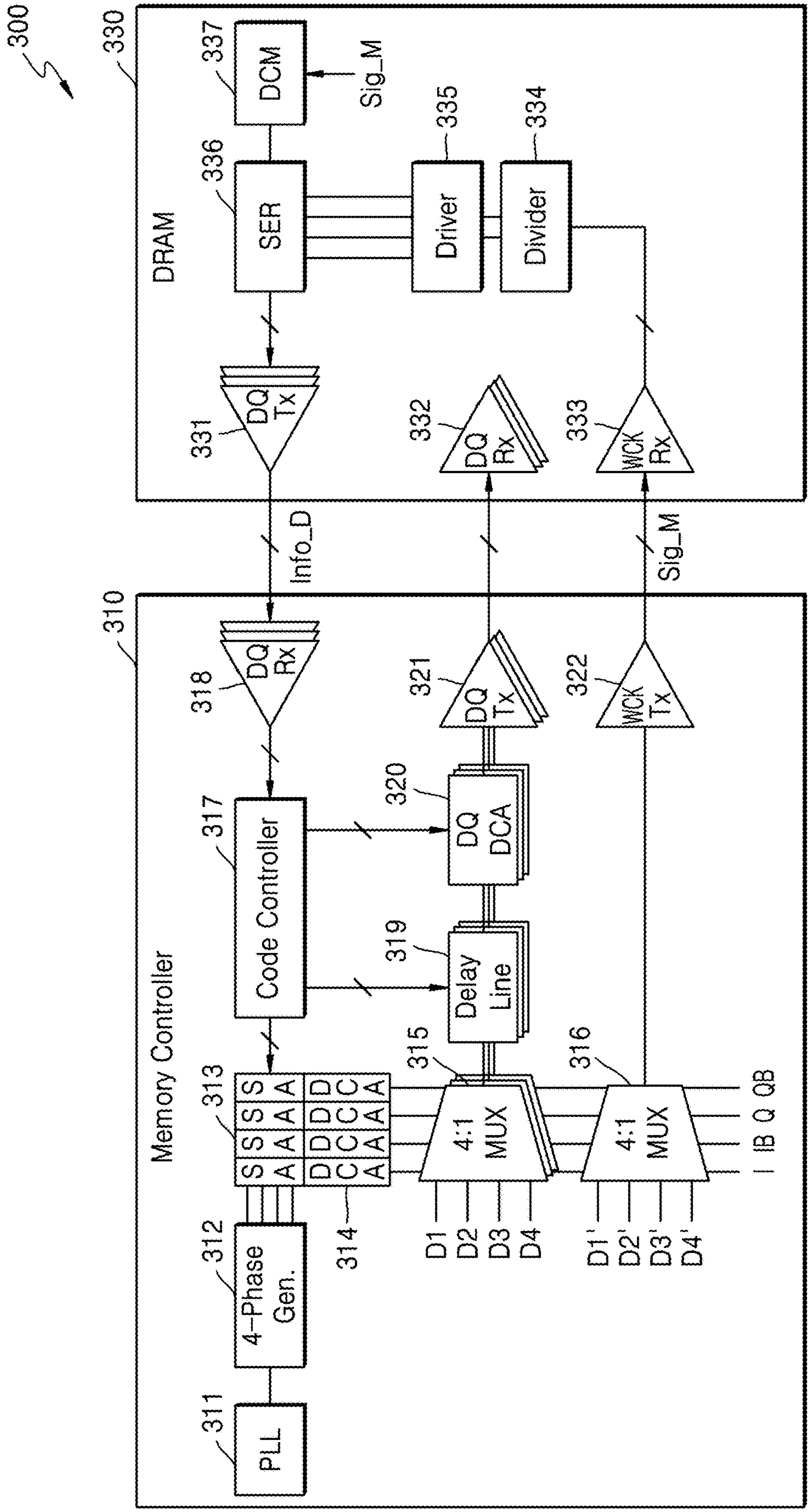
FIG. 3 is a block diagram showing an example of a memory controller and a memory system including the memory controller according to one or more example embodiments.

FIG. 3 is a block diagram showing an example of a memory controller 310 and a memory system 300 including the memory controller 310 according to one or more example embodiments.

Referring to FIG. 3, the memory system 300 may include the memory controller 310 and a memory device 330. Also, the memory controller 310 may include a phase-locked loop 311, a 4-phase clock generator 312, a skew adjuster 313, a duty adjuster 314, first and second multiplexers 315 and 316, a code controller 317, a data receiver 318, a delay line 319, a data duty adjuster 320, a data transmitter 321, and a write clock transmitter 322. Also, a DRAM may be an example of the memory device 330, and the memory device 330 may include a data transmitter 331, a data receiver 332, a write clock receiver 333, a frequency divider 334, a driver 335, a serializer 336, and a duty monitor 337. Although not shown in FIG. 3, various other components related to writing and reading the data may be further provided in each of the memory controller 310 and the memory device 330. Also, the duty adjuster may be referred to as a duty cycle adjuster (DCA), and the duty monitor may be referred to as a duty cycle monitor (DCM). In the following embodiments, the terms "duty" and "duty cycle" may be used interchangeably with the same meaning.

The phase-locked loop 311 may generate a reference clock having a certain frequency, and the 4-phase clock generator 312 may generate multi-phase clock signals (e.g., first to fourth clocks I, Q, IB, and QB). The skew adjuster 313 and the duty adjuster 314 may be arranged corresponding to each of the first to fourth clocks I, Q, IB, and QB. The skew adjuster 313 may adjust the skew of the clock based on a certain control code (e.g., skew control code) and the duty adjuster 314 may adjust the duty of the clock based on a certain control code (e.g., duty control code).

Each of the first and second multiplexers 315 and 316 may perform a sampling operation based on the first to fourth clocks I, Q, IB, and QB. For example, each of the first and second multiplexers 315 and 316 may be synchronized with the first to fourth clocks I, Q, IB, and QB or perform a sampling operation in synchronization with selection signals (not shown) generated using the first to fourth clocks I, Q, IB, and QB. In the following embodiments, each of the first and second multiplexers 315 and 316 is described as operating in synchronization with the first to fourth clocks I, Q, IB, and QB. However, the embodiments are not necessarily limited thereto. Also, the operation of synchronizing with the first to fourth clocks I, Q, IB, and QB and the operation of synchronizing with the selection signals may be defined as substantially the same concept.

The first multiplexer 315 may receive first to fourth data D1 to D4 in parallel and include a serializer that outputs the first to fourth data D1 to D4 in series in synchronization with the first to fourth clocks I, Q, IB, and QB. Also, the second multiplexer 316 may operate as a write clock generator that generates a write clock WCK. For example, the second multiplexer 316 may receive a data pattern having a plurality of bits (e.g., four bits D1' to D4') and generate the write clock WCK having a logic level corresponding to the data pattern at the edge timing of the first to fourth clocks I, Q, IB, and QB. Also, during the training process, the write clock WCK may be used as a monitoring signal Sig_M. The write clock transmitter 322 may output the monitoring signal Sig_M to the memory device 330.

Also, the delay line 319 may adjust a delay of the first to fourth data D1 to D4 output from the first multiplexer 315 and the data duty adjuster 320 may adjust the duty of the first to fourth data D1 to D4. Also, the data transmitter 321 may output the first to fourth data D1 to D4 to the memory device 330.

The write clock receiver 333 of the memory device 330 may receive the write clock WCK from the memory controller 310, and the 4-phase clock signals may be generated from the write clock WCK by the frequency divider 334 and the driver 335. The 4-phase clock signals may be provided to the serializer 336 of the memory device 330, and the serializer 336 may serialize data to be transmitted to the memory controller 310 in synchronization with the 4-phase clock signals. The data transmitter 331 may sequentially output, to the memory controller 310, pieces of data which are provided from the serializer 336. Also, during the training process, the write clock receiver 333 may receive the write clock WCK as the monitoring signal Sig_M and provide the monitoring signal Sig_M to the duty monitor 337.

The duty monitor 337 may monitor the duty of the monitoring signal Sig_M having various waveforms and generate duty information Info_D including the monitoring result. The duty information Info_D may be provided to the memory controller 310 via various transmission paths. In an embodiment, the duty information Info_D may be transmitted to the memory controller 310 via the data transmitter 331. However, the embodiments are not necessarily limited thereto, and the duty information Info_D may be transmitted to the memory controller 310 via various other transmission paths.

The data receiver 318 of the memory controller 310 may receive the data output from the memory device 330 and may also receive the duty information Info_D according to embodiments. The code controller 317 may generate various pieces of control code based on the duty information Info_D during the training process. For example, the code controller 317 may generate skew control code for controlling the skew adjuster 313 and duty control code for controlling the duty adjuster 314. Also, the code controller 317 may further generate one or more pieces of control code for controlling the delay line 319 and the data duty adjuster 320.

The memory controller 310 and the memory device 330 may transmit data between each other via a plurality of data channels. Accordingly, the first multiplexer 315, the delay line 319, the data duty adjuster 320, and the data transmitter 321 may each be provided in plurality and arranged corresponding to the plurality of data channels. In addition, the embodiment of FIG. 3 illustrates a case in which the skew adjuster 313 and the duty adjuster 314 are arranged in common for the plurality of first multiplexers 315. However, the skew adjuster 313 and the duty adjuster 314 may be arranged separately from one another for each of the plurality of first multiplexers 315.

Figure 4:
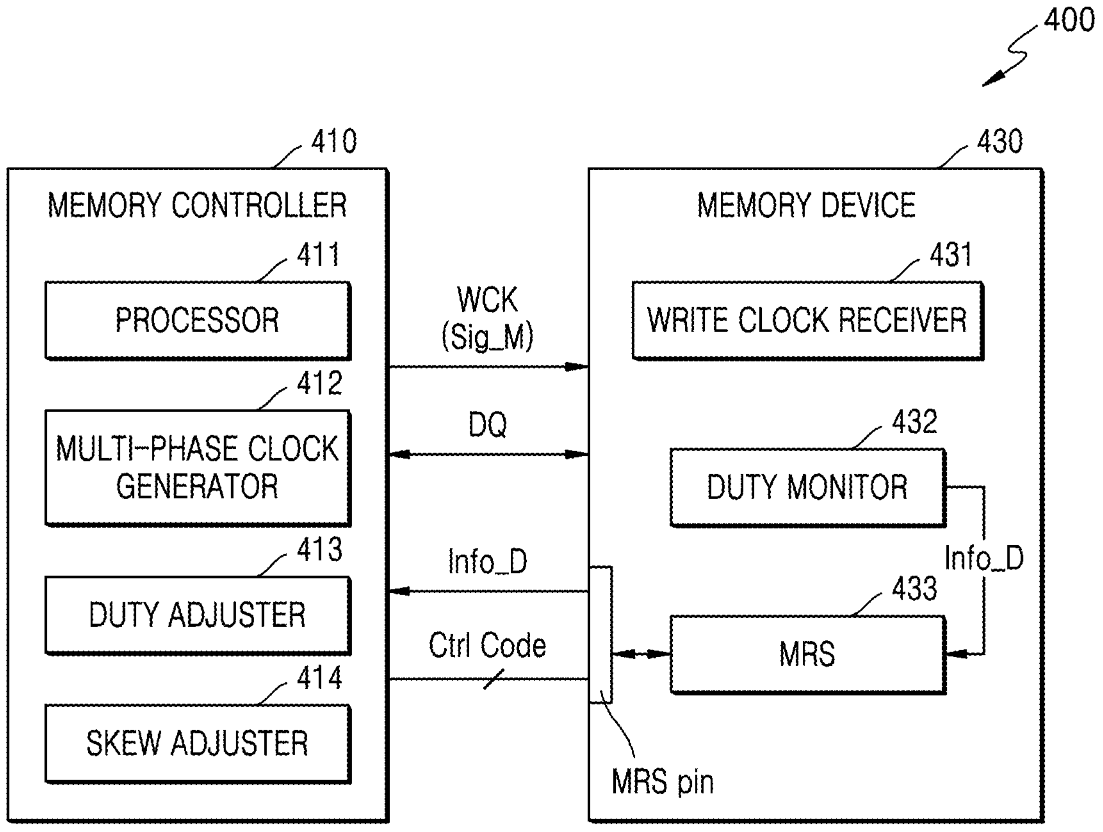
FIG. 4 is a block diagram showing an example of transmission of duty information according to one or more example embodiments.

FIG. 4 is a block diagram showing an example of transmission of duty information according to one or more example embodiments. FIG. 4 schematically shows a configuration related to the generation and transmission of duty information in a memory system 400 that includes a memory controller 410 and a memory device 430.

A processor 411 of the memory controller 410 may control training operations according to embodiments, a multi-phase clock generator 412 may generate first to fourth clocks (not shown) as multi-phase clock signals according to the above-described embodiments, and a write clock WCK or a monitoring signal Sig_M generated based on the first to fourth clocks may be output to the memory device 430. A write clock receiver 431 of the memory device 430 may receive the monitoring signal Sig_M, and a duty monitor 432 may generate duty information Info_D representing a result of monitoring the duty of the monitoring signal Sig_M.

Various signals may be transmitted and received between the memory controller 410 and the memory device 430 via various paths. For example, the memory device 430 may transmit the duty information Info_D to the memory controller 410 using a pin defined in the LPDDRx specifications, such as LPDDR4, LPDDR5, and LPDDR6. For example, the duty information Info_D may be provided to the memory controller 410 via a mode register set (MRS) pin among a plurality of pins defined in the LPDDRx specifications.

The duty monitor 432 may generate duty information Info_D and store the duty information Info_D in an MRS 433. The memory device 430 may include one or more MRS pins for storing information in or reading information from the MRS 433 by communication with the memory controller 410, and the duty information Info_D read from the MRS 433 may be provided to the memory controller 410 via the MRS pins. For example, the memory controller 410 may receive the duty information Info_D stored in the MRS 433 via a MRS read command (MRR). Based on the value of duty information Info_D, a duty adjuster 413 may adjust the duty of the first to fourth clocks and a skew adjuster 414 may adjust the skew of the first to fourth clocks.

The memory controller 410 may further generate control code Ctrl Code to adjust the duty/skew of various clock signals used in the memory device 430, and the memory controller 410 may store the control code Ctrl Code in the MRS 433 via an MRS write command (MRW). Circuits (not shown) that adjust the duty/skew of various clock signals may be provided inside the memory device 430, and the duty/skew of clock signals in the memory device 430 may be adjusted based on the control code Ctrl Code stored in the MRS 433.

FIG. 4 illustrates a case in which the duty information Info_D is transmitted via the MRS pins. As described above, however, the duty information Info_D may be transmitted via a data (DQ) pin for inputting and outputting data DQ or other types of pins.

Figure 5:
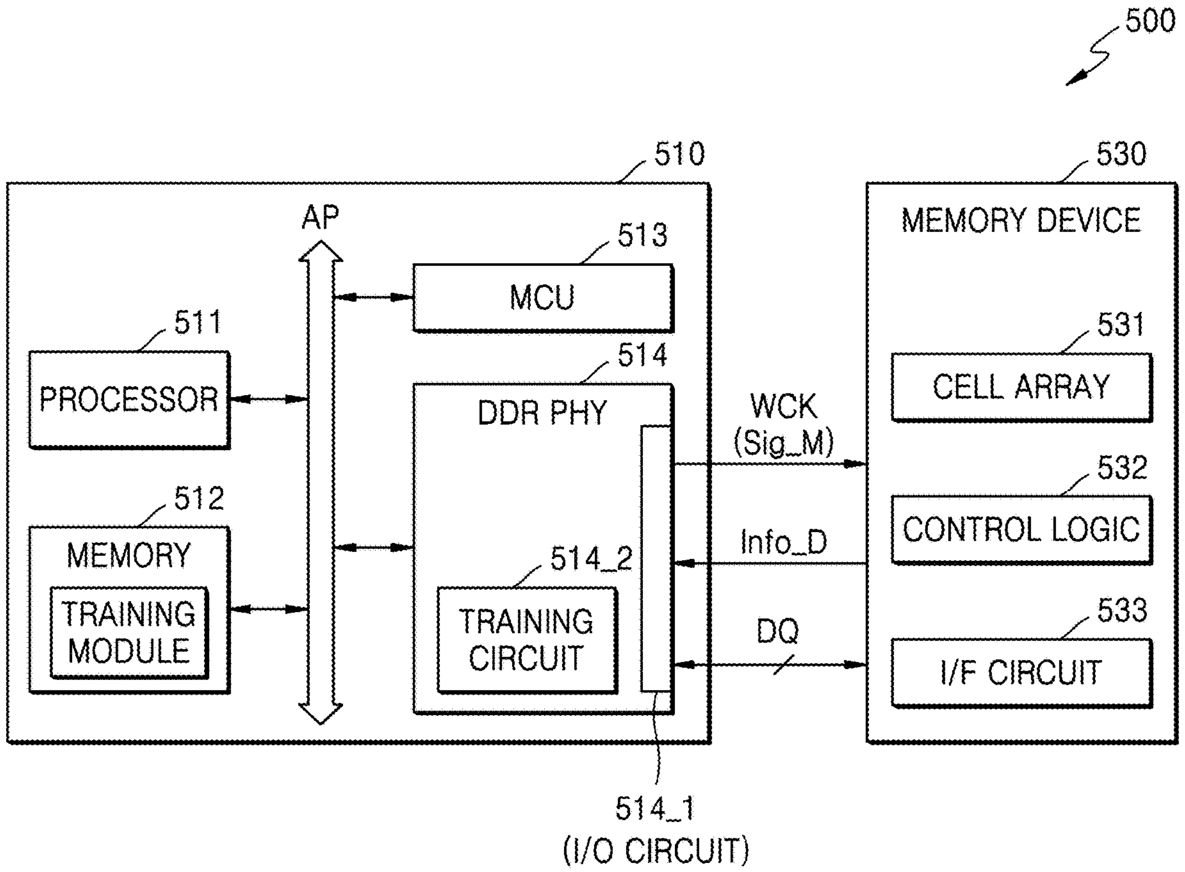
FIG. 5 is a block diagram showing a system-on-chip (SoC) employing a memory controller according to one or more example embodiments.

FIG. 5 is a block diagram showing an SoC employing a memory controller according to one or more example embodiments. A configuration including an SoC and a memory device 530 may be referred to as a memory system or a data processing system.

As shown in FIG. 5, a memory system 500 may include an AP 510 and the memory device 530, and the AP 510 may be provided as an SoC. The memory device 530 may include a cell array 531, a control logic 532, and an interface circuit 533, and the interface circuit 533 may include a dual data rate physical interface (DDR PHY).

The AP 510 may include various intellectual properties (IPs). For example, the AP 510 may include a processor 511 for controlling all operations of the memory system 500 and memory 512 for storing instructions executable by the processor 511. According to one or more example embodiments, instructions for controlling training operations may be stored, as a training module, in the memory 512, and the processor 511 may control the training operations described above according to embodiments by executing the training module. For example, the processor 511 may control a training circuit 514_2 based on the result of executing the training module.

The AP 510 may further include a memory control module (MCU) 513 configured to control access to the memory device 530 based on the control by the processor 511 and a DDR PHY 514 configured to provide a memory interface. The DDR PHY 514 may include an input/output circuit 514_1 and a training circuit 514_2, and components that generate various clock signals and components that adjust the duty/skew for the clock signals and data based on the training results (not shown) according to the embodiments described above may be further provided in the DDR PHY 514. For example, the MCU 513 and the DDR PHY 514 may include components of the memory controller in the embodiments described above.

The input/output circuit 514_1 may include the transmitters and receivers according to the above-described embodiments and may transmit various signals to and receive various signals from the interface circuit 533 of the memory device 530 during the training process according to embodiments. For example, a write clock WCK and/or a monitoring signal Sig_M generated based on 4-phase clock signals may be provided to the memory device 530 via the input/output circuit 514_1, and duty information Info_D from the memory device 530 may be received via the input/output circuit 514_1. In addition, the duty/skew of the 4-phase clock signals and data may be corrected inside the AP 510 based on the duty information Info_D.

Figure 6:
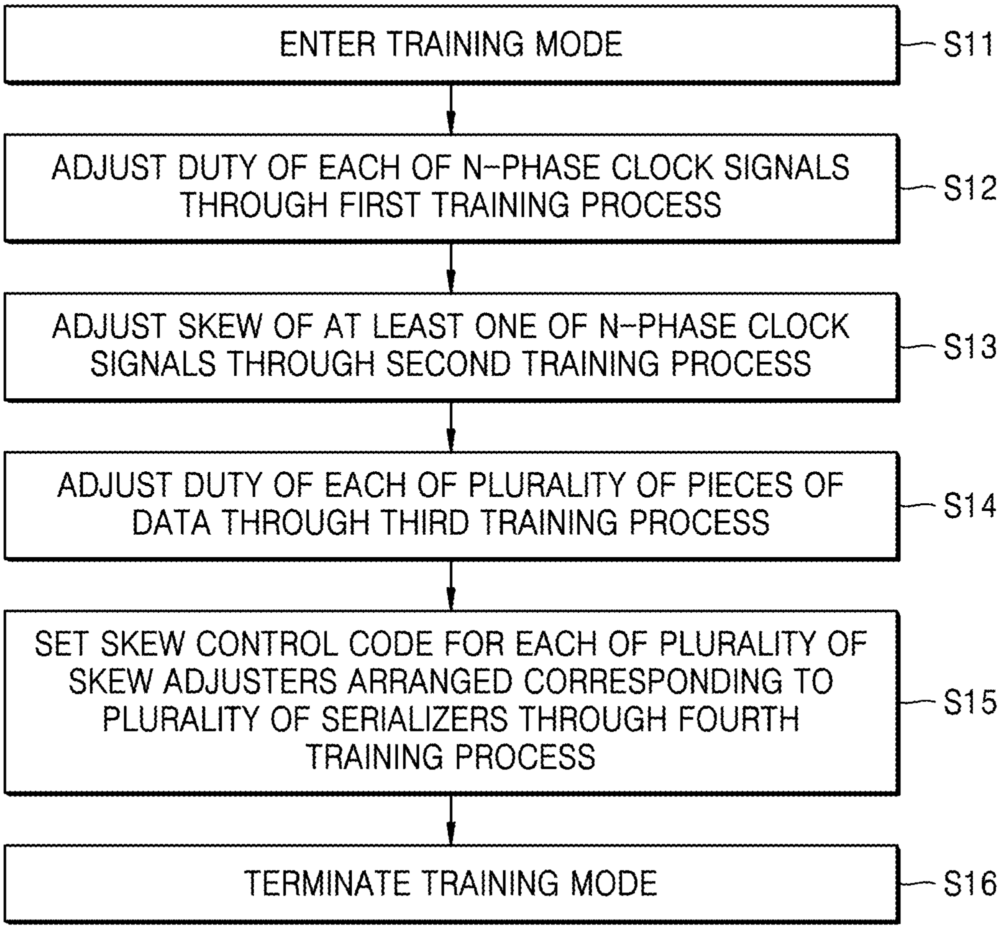
FIG. 6 is a flowchart showing a method of operating a memory controller, according to one or more example embodiments.

FIG. 6 is a flowchart showing a method of operating a memory controller, according to one or more example embodiments.

Referring to FIG. 6, the memory controller may perform a plurality of training processes related to duty/skew correction of N-phase clock signals and data. The training operation including a plurality of training processes according to one or more example embodiments is not necessarily limited to the sequence of flow shown in FIG. 6, and the order of training processes may change.

The memory controller may enter a training mode (S11) and perform training to adjust the duty of each of the N-phase clock signals in a first training process (S12). For example, in the first training process, a monitoring signal corresponding to a waveform of each of the N-phase clock signals may be generated, and an operation of monitoring the duty of the monitoring signal may be performed while changing the duty of each of the N-phase clock signals (or changing duty control code from a minimum value to a maximum value). In an embodiment, the memory controller may generate a monitoring signal using the N-phase clock signals and transmit the monitoring signal to the memory device, and the memory device may transmit duty information according to the duty monitoring result for the monitoring signal to the memory controller. The memory controller may set duty control code for each of the N-phase clock signals based on the duty information received from the memory device.

Also, the memory controller may perform training to adjust the skew of at least one of the N-phase clock signals in a second training process (S13). For example, in the second training process, a monitoring signal corresponding to a waveform of each of the N-phase clock signals may be generated, and an operation of monitoring the duty of the monitoring signal may be performed while changing the skew of at least one of the N-phase clock signals (or changing skew control code from a minimum value to a maximum value). The memory controller may perform a skew correction operation so that a phase difference between the N-phase clock signals has a constant value by setting at least one skew control code of the N-phase clock signals based on the duty information received from the memory device.

The memory controller may perform training to adjust the data duty for each of a plurality of pieces of data in a third training process (S14). For example, a delay line and a data duty adjuster may be arranged in a data transmission path inside the memory controller. In the third training process, the operation of measuring the valid window size of the data may be repeatedly performed while changing the delay and duty of the data. For example, the memory controller may transmit and write data to the memory device while changing the delay and duty and may measure the valid window size of the data by comparing the write data with the data read from the memory device.

The memory controller may set data duty control code that optimizes the data duty based on the measured valid window size. If the memory controller transmits the data to the memory device via a plurality of data channels, the data duty control code described above may be set for data corresponding to each of the plurality of data channels.

In addition, in an embodiment, the memory controller may include a plurality of serializers that serially output data, and a separate skew adjuster may be provided corresponding to each of the plurality of serializers. Each of the plurality of serializers may receive N-phase clock signals, and the skew adjuster may adjust the skew of the N-phase clock signals provided to a corresponding serializer. In a fourth training process, the memory controller may perform training to measure the valid window size of the data while changing the skew of at least one of the N-phase clock signals for the data output via each of the serializers and set skew control code of a plurality of skew adjusters corresponding to the plurality of serializers based on the measurement results of the valid window size (S15). Through the fourth training process described above, the skew control code that can optimally correct the skew of the N-phase clock signals for each of the pieces of data may be set with respect to a plurality of data channels having different signal transmission characteristics.

When the training operations according to the embodiments as described above and other training operations for various other signals and data are completed, the training mode may be ended (S16).

Hereinafter, examples of the training operations according to embodiments are described. In the following embodiments, first to fourth clocks I, Q, IB, and QB are described as the multi-phase clock signals, and a plurality of operations in each of the training processes for the first to fourth clocks I, Q, IB, and QB and data are described. However, the embodiments are not necessarily limited to the scope of the following description, and the training order for clocks and data and the execution order or method for the plurality of operations in each of the training processes may be changed in various manner.

Figure 7:
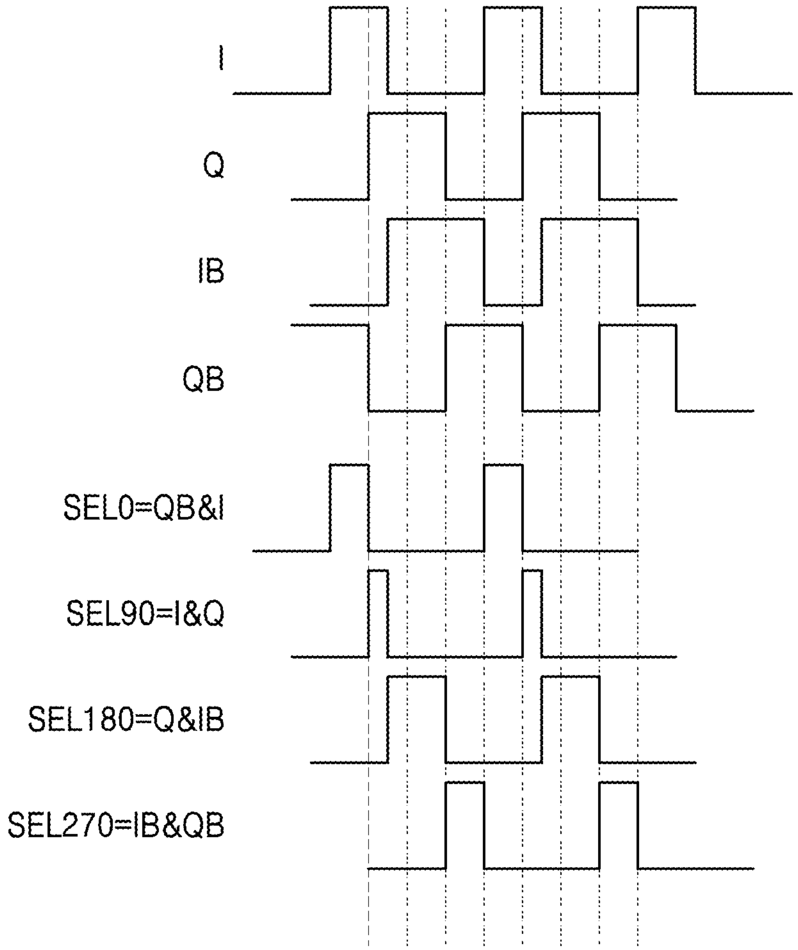
FIG. 7 shows waveforms of first to fourth selection signals when distortion occurs in duties of first to fourth clocks.

FIG. 7 shows waveforms of first to fourth selection signals SEL0 to SEL270 when distortion occurs in the duty of first to fourth clocks I, Q, IB, and QB.

FIG. 7 shows an example in which distortion occurs in the duty of the first and third clocks I and IB. As distortion occurs in the duty of at least one of the first to fourth clocks I, Q, IB, and QB, distortion occurs in the pulse width and edge timing of the first to fourth selection signals SEL0 to SEL270. In this case, the valid window margin decreases during a high-speed data input/output operation, which causes deterioration of data input/output characteristics.

Figure 8A:
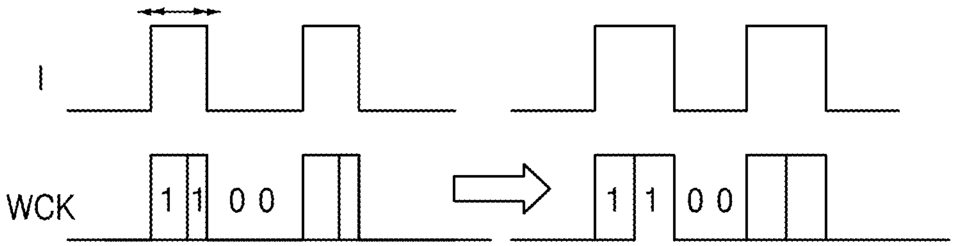
FIGS. 8A and 8B are diagrams showing an example of a training process of adjusting duties of multi-phase clock signals according to one or more example embodiments.
Figure 8B:
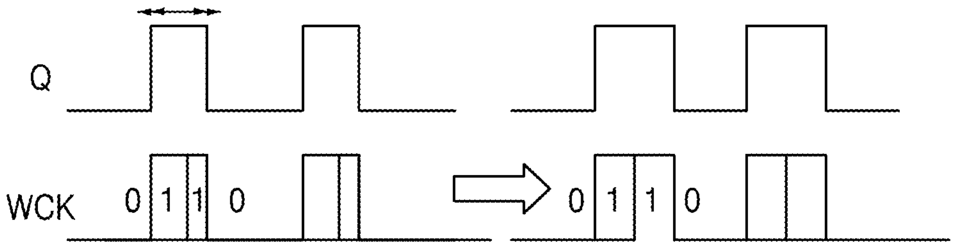

FIGS. 8A and 8B are diagrams showing an example of a training process of adjusting duties of multi-phase clock signals according to one or more example embodiments. As described above, the operation of correcting the duties of multi-phase clock signals according to one or more example embodiments may be performed based on monitoring the duty of the write clock WCK corresponding to the monitoring signal. Accordingly, the training process for correcting the duties of multi-phase clock signals may belong to the training operation for the write clock WCK.

Referring to FIG. 8A, regarding the duty adjustment of multi-phase clock signals, four bits of the data pattern in a first operation may have a value of "1100." Accordingly, the waveform of the write clock WCK generated in synchronization with the first to fourth clocks I, Q, IB, and QB may have a waveform corresponding to the first clock I. For example, since the first clock I and the third clock IB have inverted waveforms, the falling edge timing of the first clock I may be the same as the rising edge timing of the third clock IB. Accordingly, the write clock WCK may be changed to a logic low level at the timing of the falling edge of the first clock I.

For example, the memory controller may provide the memory device with the write clock WCK generated while the duty control code of the duty adjuster that adjusts the duty of the first clock I is changed from the minimum value (min) to the maximum value (max) and may compare a size of a logic high section of the first clock I with a size of a logic low section of the first clock I based on the value of the duty information Info_D provided from the memory device. For example, when the logic high section is smaller than the logic low section as a result of duty monitoring for the write clock WCK, the duty information Info_D of a first value (e.g., a value of "0") may be provided. On the other hand, when the logic high section is greater than the logic low section, the duty information Info_D of a second value (e.g., a value of "1") may be provided. The memory controller may determine duty control code upon which the value of duty information Info_D changes from the first value to the second value and may set the duty control code determined in the first operation as duty control code for adjusting the duty of the first clock I.

Also, as shown in FIG. 8B, the data pattern may have a value of "0110" in a second operation. Accordingly, the waveform of the write clock WCK may have a waveform corresponding to the second clock Q, and the duty of the second clock Q may be adjusted in the second operation. For example, the value of duty information Info_D provided from the memory device may be determined while changing the duty control code of the duty adjuster that adjusts the duty of the second clock Q from the minimum value (min) to the maximum value (max). Also, the memory controller may determine the duty control code upon which the value of duty information Info_D changes from the first value to the second value, and the determined duty control code may be set as the duty control code for adjusting the duty of the second clock Q.

Although not shown, similar to the first and second operations described above, the data pattern in a third operation may have a value of "0011." Accordingly, the waveform of the write clock WCK may have a waveform corresponding to the third clock IB, and the duty of the third clock IB may be adjusted in the third operation. Also, the data pattern in a fourth operation may have the value of "1001." Accordingly, the waveform of the write clock WCK may have a waveform corresponding to the fourth clock QB, and the duty of the fourth clock QB may be adjusted in the fourth operation.

Based on the above processes, the duty of each of the first to fourth clocks I, Q, IB, and QB may be corrected. Accordingly, the waveform characteristics of the first to fourth selection signals SEL0 to SEL270 generated based on this correction may be improved.

While the duty of each of the first to fourth clocks I, Q, IB, and QB is corrected by the training process described above, skews may still exist in the first to fourth clocks I, Q, IB, and QB. According to embodiments, a training process of correcting the skews of the first to fourth clocks I, Q, IB, and QB may be performed as follows.

FIGS. 9 to 11A and 11B are diagrams showing an example of a training process of adjusting skews of multi-phase clock signals according to one or more example embodiments. As described above, the operation of correcting the skews of the multi-phase clock signals may also be performed based on monitoring the duty of the write clock WCK. Accordingly, in the training process of adjusting the skews of the multi-phase clock signals, the write clock WCK having various waveforms may be generated as a monitoring signal.

Figure 9:
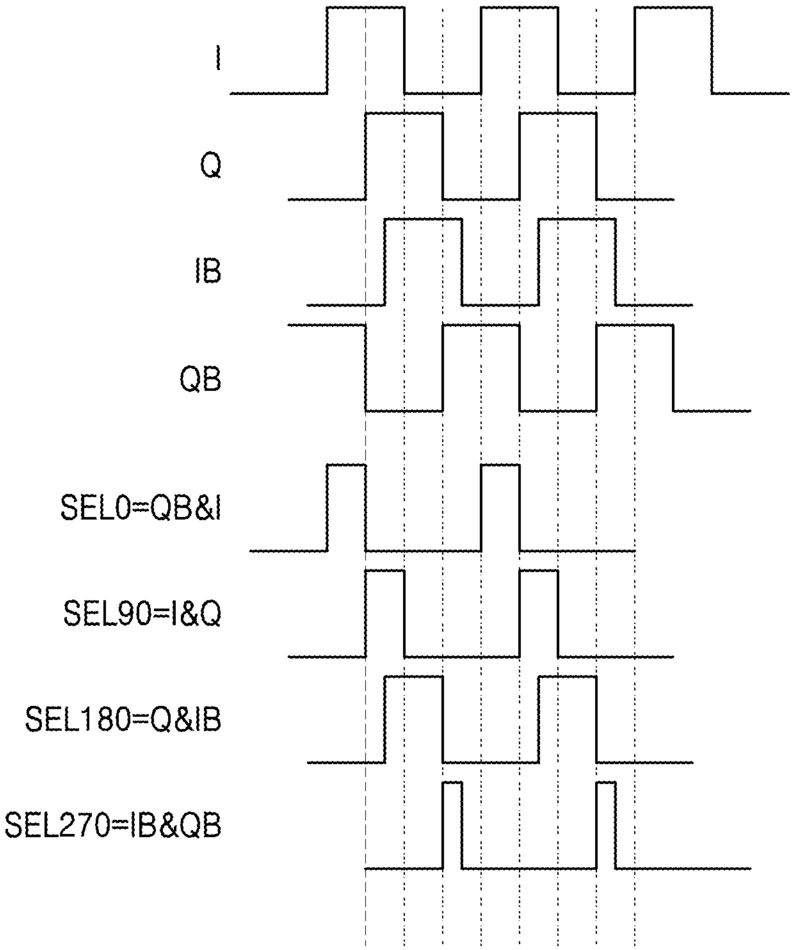

As shown in FIG. 9, even after the duty of each of the first to fourth clocks I, Q, IB, and QB is corrected, the skew may exist in at least one of the first to fourth clocks I, Q, IB, and QB. In this case, distortion occurs in the waveforms of the first to fourth selection signals SEL0 to SEL270. For example, FIG. 9 illustrates a case in which distortion occurs in the waveforms of the third and fourth selection signals SEL180 and SEL270 when a skew exists in the third clock IB. In this case, the valid window margin decreases during high-speed data input/output operations.

Figure 10A:
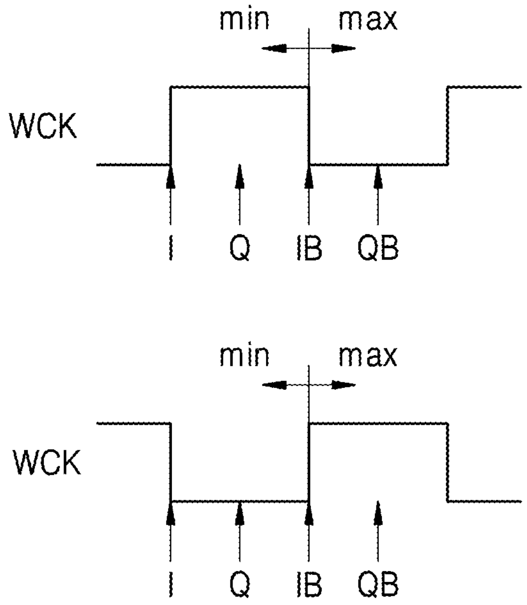

Referring to FIG. 10A, with respect to the skew adjustment of multi-phase clock signals, the skew between the first clock I and the third clock IB may be corrected in a first operation by adjusting the skew of at least one of the first clock I and the third clock IB. For example, the data pattern may have a value of "1100" as a no-flip value and "0011" as a flip value in the first operation. Accordingly, the write clocks WCK having a waveform corresponding to the first clock I and a waveform corresponding to the third clock IB may be generated as monitoring signals. In addition, the duty of the write clock WCK may be monitored while adjusting the skew of at least one of the first to fourth clocks I, Q, IB, and QB. For example, the duty of the write clock WCK generated while changing skew control code of the third clock IB from the minimum value (min) to the maximum value (max) may be monitored.

In the case of the write clock WCK shown in an upper part of FIG. 10A, the waveform of the write clock WCK may change from logic high to logic low in synchronization with the third clock IB. When the skew control code for the third clock IB has the minimum value (min), the logic high section of the write clock WCK may be relatively narrowed. Also, the duty of the write clock WCK may be monitored while increasing the value of the skew control code. As the logic high section of the write clock WCK gradually increases, the skew control code may be determined at the timing when the value of the duty information Info_D changes from the first value to the second value.

Similarly, in the case of the write clock WCK shown in a lower part of FIG. 10A, the waveform of the write clock WCK may change from logic low to logic high in synchronization with the third clock IB. When the skew control code for the third clock IB has the minimum value (min), the logic high section of the write clock WCK may be relatively enlarged. Also, the duty of the write clock WCK may be monitored while increasing the value of the skew control code. The skew control code may be determined at the timing when the value of the duty information Info_D changes from the second value to the first value.

In an embodiment, an average value or a median value of two pieces of skew control code determined using the no-flip and flip values may be applied as the skew control code for the third clock IB. For example, if the skew control code having a value of 0 is determined when using the no-flip value and the skew control code having a value of +2 is determined when using the flip value, a value of +1 corresponding to the average value may be set as the skew control code for the third clock IB. Through the first operation of the training process described above, the skew between the first clock I and the third clock IB may be corrected.

Figure 10B:
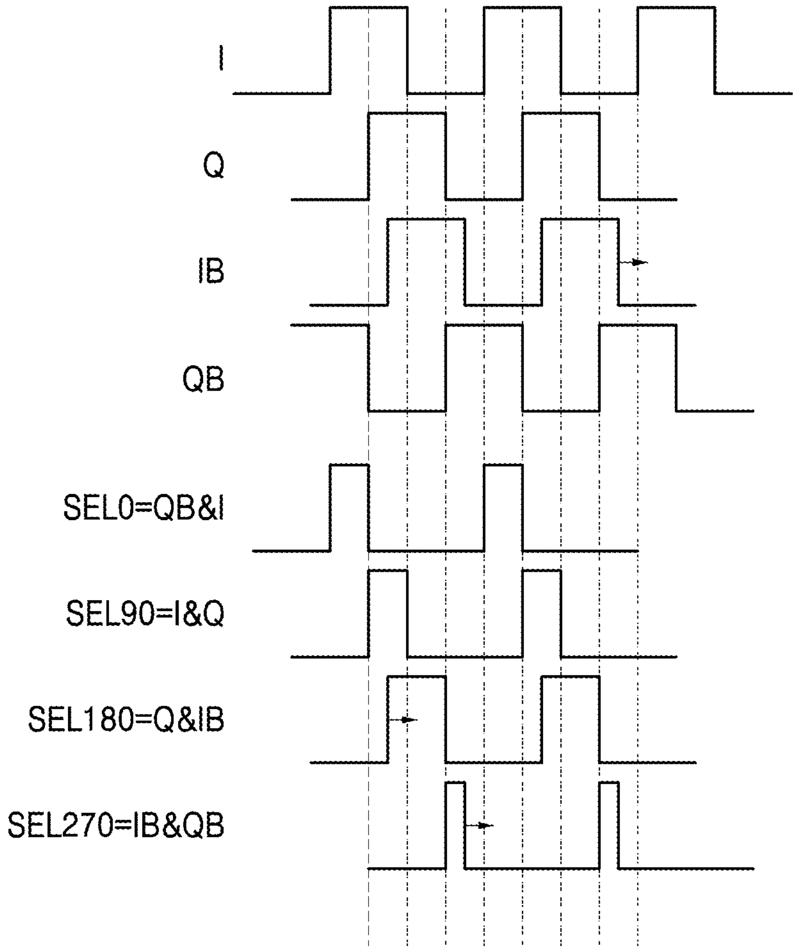

FIG. 10B illustrates a case in which the rising edge and the falling edge of the logic level of the third clock IB are delayed due to the skew control operation for the third clock IB of FIG. 10A. Accordingly, the skew between the first clock I and the third clock IB is corrected, and the waveforms of the third and fourth selection signals SEL180 and SEL270 are also corrected.

Figure 11A:
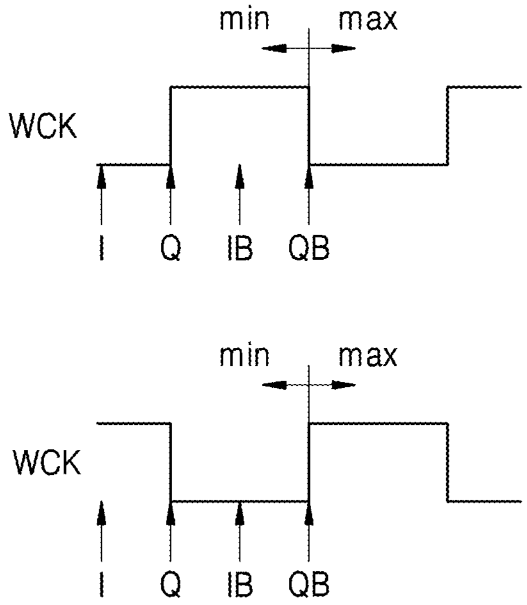

As shown in FIG. 11A, with respect to the skew adjustment of multi-phase clock signals, the skew between the second clock Q and the fourth clock QB may be corrected in a second operation. For example, the data pattern may have a value of "0110" as a no-flip value and "1001" as a flip value in the second operation. Accordingly, the write clocks WCK having a waveform corresponding to the second clock Q and a waveform corresponding to the fourth clock QB may be generated as monitoring signals. In addition, the duty of the write clock WCK generated while changing skew control code of the fourth clock QB from the minimum value (min) to the maximum value (max) may be monitored.

According to the results of monitoring the duty of the write clock WCK while changing the skew control code of the fourth clock QB, the skew control code may be determined during the monitoring process using "0110" as the no-flip value and the skew control code may be determined during the monitoring process using "1001" as the flip value. The average value of the two pieces of skew control code determined by using the no-flip and flip values may be set as the skew control code for the fourth clock QB. Through the second operation of the training process described above, the skew between the second clock Q and the fourth clock QB may be corrected.

Figure 11B:
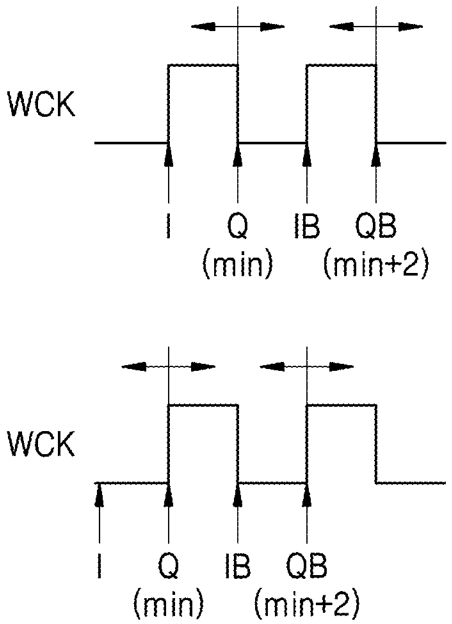

As shown in FIG. 11B, with respect to the skew adjustment of multi-phase clock signals, the skew between the first clock I and the second clock Q may be corrected in a third operation, and the skew between the third clock IB and fourth clock QB may also be corrected. The data pattern may have a value of "1010" as a no-flip value and a value of "0101" as a flip value in the third operation. Accordingly, the write clocks WCK having complementary waveforms and frequencies twice those of the 4-phase clock signals may be generated as monitoring signals. In addition, the duty of the write clock WCK generated while changing skew control code of the second clock Q and the fourth clock QB from the minimum value (min) to the maximum value (max) may be monitored.

In an embodiment, when the skew control code of the fourth clock QB is preset in the previous operation, the value of the skew control code set for the fourth clock QB may be applied as an offset. For example, when adjusting the skew of the fourth clock QB, if the skew control code calculated in the second operation corresponds to +2, the skew control code of the fourth clock QB in the third operation may gradually increase from a value (min+2). That is, the skew control code having a value of +2 has been set for the fourth clock QB in the preceding second operation so that the second clock Q and the fourth clock QB have a phase difference of 180 degrees, an offset of +2 is applied to the skew control code of the fourth clock QB in the third operation. Accordingly, the monitoring operation may be performed while maintaining the phase difference between the second clock Q and the fourth clock QB at 180 degrees and adjusting the skew of the second clock Q and the fourth clock QB.

Regarding the second clock Q, both the skew control code when using the no-flip value and the skew control code when using the flip value may be determined based on the result of monitoring the duty of the write clock WCK. The average value of the two pieces of determined skew control code may be set as the skew control code for the second clock Q. Also, regarding the fourth clock QB, both the skew control code when using the no-flip value and the skew control code when using the flip value may be determined based on the result of monitoring the duty of the write clock WCK in the above-described manner. The average value of the two pieces of determined skew control code may be set as the skew control code for the fourth clock QB. Through the third operation of the training process described above, the skew between the first clock I and the second clock Q may be corrected, and the skew between the third clock IB and the fourth clock QB may also be corrected.

Figure 12:
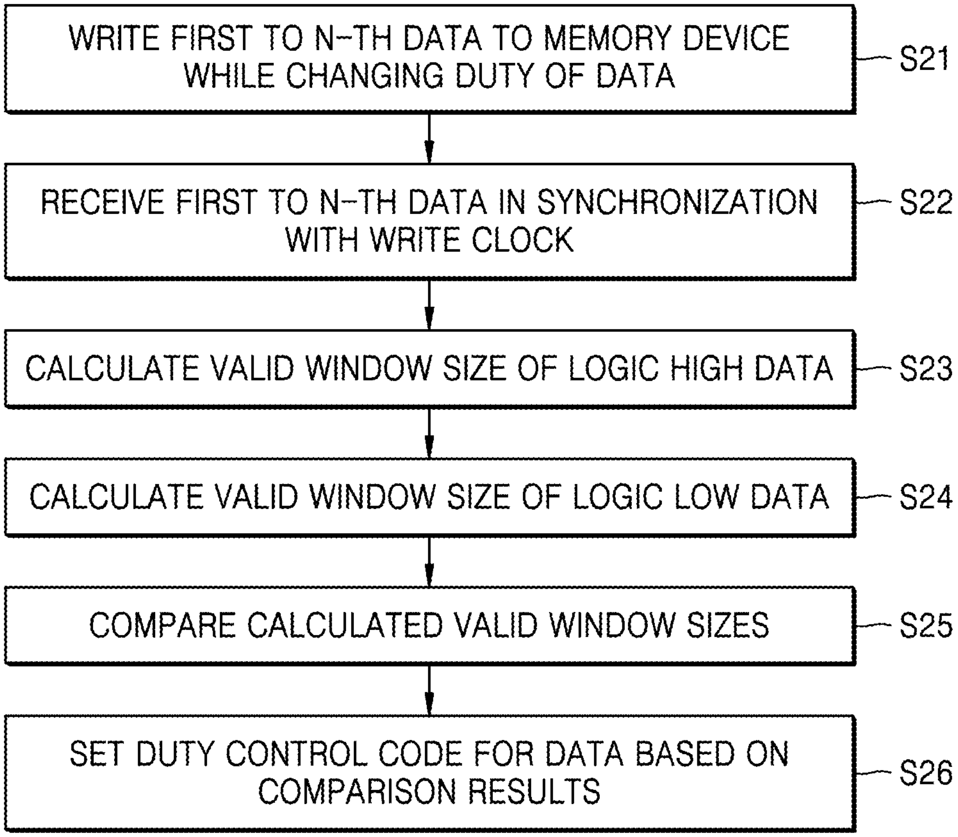
FIG. 12 is a flowchart showing an operation method in which a memory controller performs data duty training according to one or more example embodiments.

FIG. 12 is a flowchart showing an operation method in which a memory controller performs data duty training according to one or more example embodiments.

Even after correcting the duty and skew of multi-phase clock signals according to the above-described embodiments, the duty characteristics of data received by a data receiver of the memory device may not be ideal due to the characteristics of a path through which the data is transmitted. In order to compensate for distortion of the duty characteristics of data, the memory controller according to embodiments may perform data duty training and set the duty control code of the data duty adjuster inside the memory controller based on the training results.

As shown in FIG. 12, during the training process of adjusting the duty of data, the memory controller may perform operations of recording write data having certain bit values in the memory device, reading the write data again from the memory device, and comparing the write data with the read data to check whether the write data and read data are identical to each other. For example, the valid window size of the data may be measured by applying a delay to the data and repeating the operation of comparing the write data with the read data, and the training operation may be performed such that the valid window of data has the maximum size.

According to one or more example embodiments, in the training process of adjusting the duty of data, the memory controller may write first to N-th data to the memory device while changing the duty of the data (S21). Assuming first to fourth data, the first to fourth data may have bit values with continuously toggling logic levels. For example, the first and third data may have a value of "1" and the second and fourth data may have a value of "0." The memory controller may generate the write clock WCK described above and receive the first to fourth data from the memory device in synchronization with the write clock WCK (S22).

As described above, the writing and reading of data are repeatedly performed by applying the delay to the first to fourth data, and the comparison between the write data and the read data is repeatedly performed. Accordingly, the valid window size for each of the first to fourth data may be measured. For example, a valid window size (a first size) of the data having a logic high level may be measured (S23), and a valid window size (a second size) of the data having a logic low level may be measured (S24). If the first and third data are referred to as even data and the second and fourth data are referred to as odd data, the valid window size of the even data and the valid window size of the odd data may be measured.

The valid window size of the data having the logic high level may be compared with the valid window size of the data having the logic low level (S25). As the above-described operation is repeatedly performed while changing the duty of data, the first size may be determined to be less than the second size when a section of the logic high level of the data is shorter than a section of the logic low level of the data.

As the duty of data gradually increases, the section of the logic high level of the data may gradually increase. According to the result of comparing the first size with the second size, the duty control code at the point in time when the first size becomes greater than the second size may be determined. Based on the comparison result of the valid window size described above, the duty control code for the data may be set (S26).

Also, according to the above-described embodiments, the memory controller and the memory device may communicate data with each other via a plurality of data channels, and the data duty adjuster may be separately arranged corresponding to each of the data channels. The data duty adjustment described above may be performed separately for each of the data channels, and thus, different pieces of data duty control code may be respectively set for the data channels.

Figure 13:
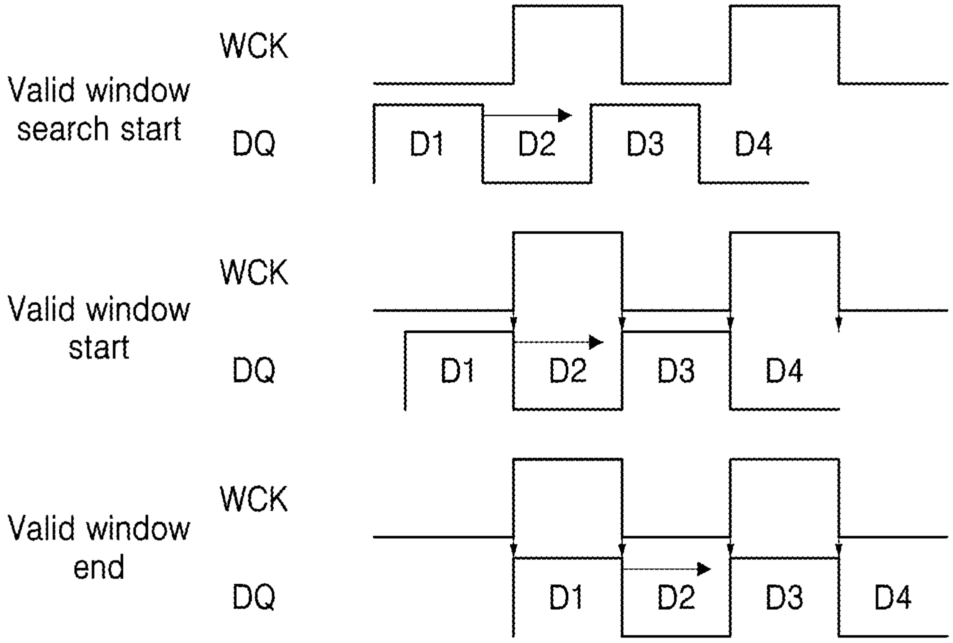
FIGS. 13, 14A, and 14B are diagrams showing examples of performing data duty training according to one or more example embodiments.
Figure 14A:
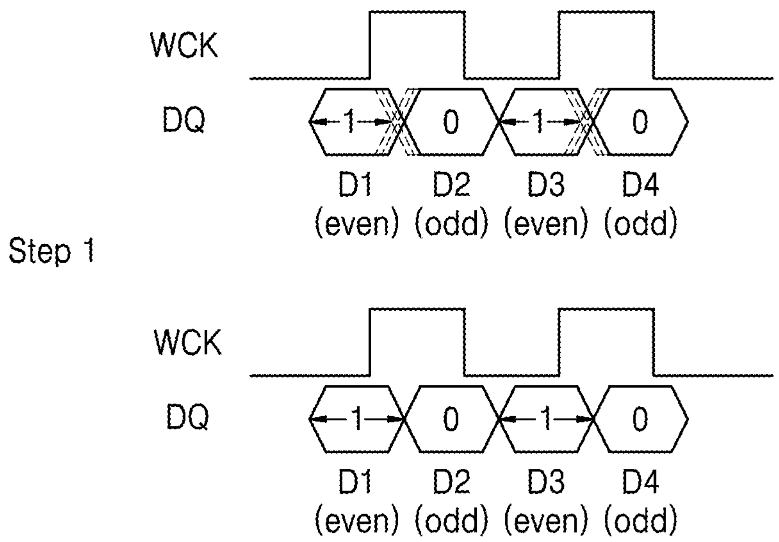
Figure 14B:
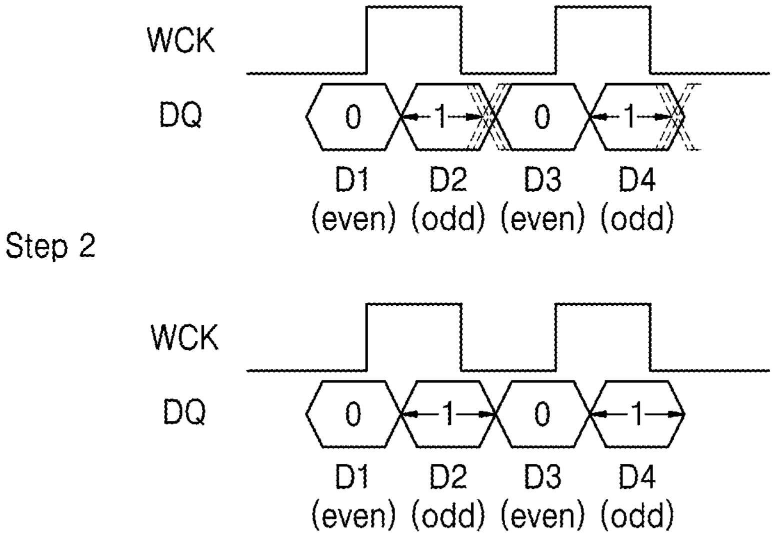

FIGS. 13, 14A, and 14B are diagrams showing examples of performing data duty training according to one or more example embodiments.

FIG. 13 shows an example of measuring the valid window size and illustrates a case in which the first to fourth data D1 to D4 read from the memory device are received in synchronization with the write clock WCK while increasing delay of the data. As the delay of the first to fourth data D1 to D4 is gradually increased, the point at which the values of the write data and the read data become equal to each other may correspond to the start point of the size of the valid window. As the delay of the first to fourth data D1 to D4 is further increased, the point at which the values of the write data and the read data become different from each other may correspond to the end point of the size of the valid window. The valid window size for each of the first to fourth data D1 to D4 may be measured based on repeating the writing and reading of the first to fourth data D1 to D4 while applying the delay as described above.

For example, the first and third data D1 and D3 may be sampled at the rising edge of the write clock WCK and referred to as even data. Also, the second and fourth data D2 and D4 may be sampled at the falling edge of the write clock WCK and referred to as odd data. In an embodiment, the training process for adjusting the duty of data may be performed based on the comparison of valid window sizes between the even data and the odd data.

FIGS. 14A and 14B show an example of setting duty control code of data according to one or more example embodiments.

Referring to FIG. 14A, a process of measuring the above-described valid window size while changing the duty of data from the minimum value to the maximum value and a process of comparing the valid window sizes of the even data and the odd data with each other may be performed repeatedly. In a first operation of the data duty training in FIG. 14A, the even data may have a value of "1" corresponding to the logic high level and the odd data may have a value of "0" corresponding to the logic low level.

When the duty of data has a minimum value, a section of the logic high level may be shorter than a section of the logic low level. Accordingly, the valid window size of odd data may be greater than the valid window size of even data. Subsequently, in a waveform shown in a lower part of FIG. 14A, as the duty of data gradually increases, the timing at which the valid window size of the even data becomes greater than the valid window size of the odd data may be determined. Duty control code (e.g., first duty control code) at the corresponding timing may be calculated.

Also, in a second operation of the data duty training in FIG. 14B, the even data may have a value of "0" corresponding to the logic low level and the odd data may have a value of "1" corresponding to the logic high level. Even in the second operation of data duty training, an operation of comparing the valid window size of the even data with the valid window size of the odd data while changing the duty of data may be performed. In addition, in the waveform shown in a lower part of FIG. 14B, the timing at which the valid window size of the odd data becomes greater than the valid window size of the even data may be determined. Duty control code (e.g., second duty control code) at the corresponding timing may be calculated. According to one or more example embodiments, the duty control code for the data may be set to have the average value of the first duty control code and the second duty control code, and thus, the duty for data may be optimally adjusted by the training process.

Figure 15:
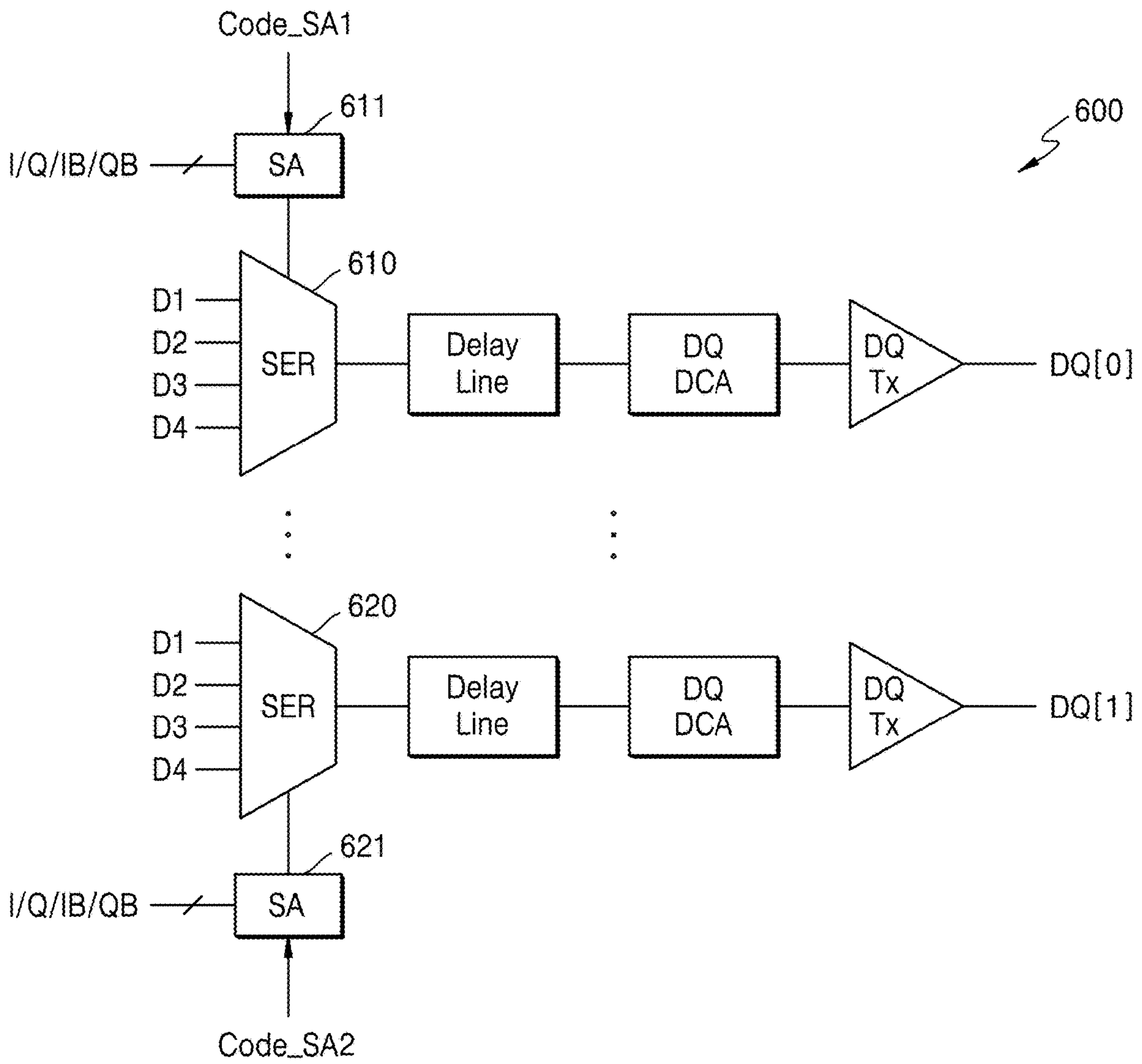
FIG. 15 is a block diagram showing an example of a memory controller according to one or more example embodiments.

FIG. 15 is a block diagram showing an example of a memory controller according to another embodiment. A memory controller 600 may include a plurality of serializers corresponding to a plurality of data channels, and an embodiment is described using first and second serializers 610 and 620 among the plurality of serializers as examples.

Each of the first and second serializers 610 and 620 may receive first to fourth clocks I, Q, IB, and QB, and separate skew adjusters may be arranged corresponding to the first and second serializers 610 and 620. Accordingly, the memory controller 600 may include a first skew adjuster 611 corresponding to the first serializer 610 and a second skew adjuster 621 corresponding to the second serializer 620. In addition, a separate delay line, a separate data duty adjuster, and a separate data output unit may be arranged corresponding to each of the serializers, and output data (DQ[0,1]) may be output to a memory device in parallel via a plurality of data channels.

When taking the 4-phase clock signals as an example, each of the first and second serializers 610 and 620 may sequentially output the first to fourth data D1 to D4 according to the above-described embodiments. Also, the data channels may have different channel characteristics. Therefore, when the first to fourth clocks I, Q, IB, and QB having the same waveform are provided in common to the first and second serializers 610 and 620, different channel characteristics are not reflected. Accordingly, the valid window characteristics of data may vary for each of the data channels. According to embodiments, pieces of skew control code having different values may be respectively set for the data channels by the training process. Therefore, a first skew control code Code_SA1 may be provided to the first skew adjuster 611 and a second skew control code Code_SA2 may be provided to the second skew adjuster 621.

FIGS. 16A, 16B, 16C, and 17 are diagrams showing examples of setting skew control code for each data channel according to one or more example embodiments. FIGS. 16A, 16B, 16C, and 17 illustrate a case in which skew control code for a skew adjuster arranged corresponding to one serializer is set, and skew control code may be set by the same method for a skew adjuster arranged corresponding to another serializer.

According to one or more example embodiments, a training process for correcting skews of multi-phase clock signals for each of the data channels may be performed, and the training process may be performed based on measurement of the valid window size of data according to the above-described embodiment. For example, as described above, the valid window size may be measured by comparing the write data with the read data while changing the delay of the data on a transmission path from the minimum value to the maximum value. In an embodiment, the operation of measuring the valid window size may be performed while changing a skew of at least one of the multi-phase clock signals.

In an embodiment, the training process described above may include first to third operations. In a first operation shown in FIG. 16A, the skew between the first clock I and the third clock IB may be adjusted. For example, the first to fourth data D1 to D4 are received from the memory device in synchronization with the write clock WCK, and the valid window size of each of the first to fourth data D1 to D4 is measured. Accordingly, the valid window size of each of the first to fourth data D1 to D4 may be measured while changing the skew control code of the third clock IB from the minimum value (min) to the maximum value (max). Also, when the skew control code of the third clock IB has the minimum value (min), the valid window size of the second data D2 may be measured to be small, but the valid window size of the third data D3 may be measured to be large. Also, as the skew control code of the third clock IB gradually increases, the valid window size of the second data D2 may gradually increase, but the valid window size of the third data D3 may gradually decrease.

Figure 16A:
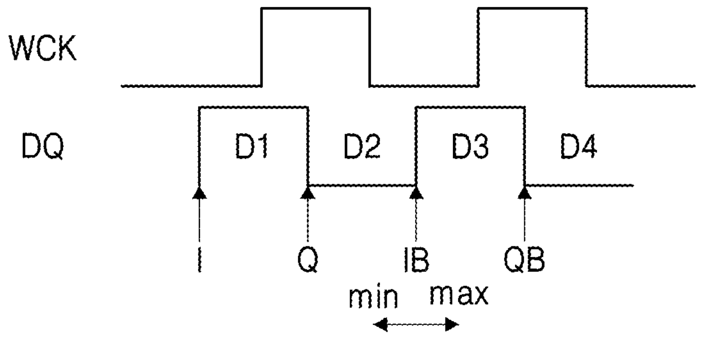
FIGS. 16A, 16B, 16C, and 17 are diagrams showing examples of setting skew control code for each data channel according to one or more example embodiments.

In an example of FIG. 16A, a sum of the valid window sizes of the first and second data D1 and D2 may be compared with a sum of the valid window sizes of the third and fourth data D3 and D4. Also, as the skew control code of the third clock IB gradually increases, the sum of the valid window sizes of the first and second data D1 and D2 may gradually increase. Skew control code at a point in time when the sum of the valid window sizes of the first and second data D1 and D2 becomes greater than the sum of the valid window sizes of the third and fourth data D3 and D4 may be set as the skew control code for the third clock IB. In addition, in the example of FIG. 16A, the skew between the first clock I and the third clock IB may be corrected by setting the skew control code for the third clock IB.

Figure 16B:
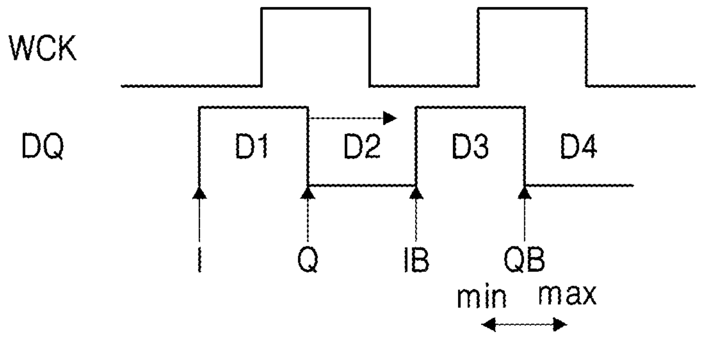

Similarly, the second operation shown in FIG. 16B illustrates a case of correcting the skew between the second clock Q and the fourth clock QB. The valid window size of each of the first to fourth data D1 to D4 may be measured while changing the skew control code of the fourth clock QB from the minimum value (min) to the maximum value (max). In an example of FIG. 16B, the sum of the valid window sizes of the second and third data D2 and D3 may be compared with the sum of the valid window sizes of the first and fourth data D1 and D4. Also, skew control code at a point in time when the sum of the valid window sizes of the second and third data D2 and D3 becomes greater than the sum of the valid window sizes of the first and fourth data D1 and D4 may be set as the skew control code for the fourth clock QB.

Figure 16C:
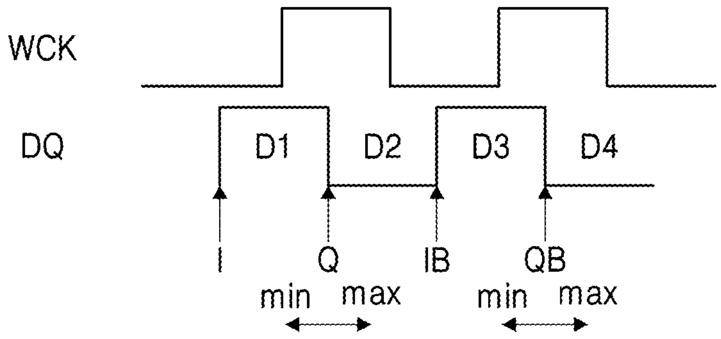

In addition, the third operation shown in FIG. 16C illustrates a case of correcting the skew between the first clock I and the second clock Q. The valid window size of each of the first to fourth data D1 to D4 may be measured while changing the skew control code of the second clock Q and the fourth clock QB from the minimum value (min) to the maximum value (max). In an example of FIG. 16C, a sum of the valid window sizes of the first and third data D1 and D3 may be compared with a sum of the valid window sizes of the second and fourth data D2 and D4. In addition, the skew control code of the second clock Q and the fourth clock QB at a point in time when the sum of the valid window sizes of the first and third data D1 and D3 becomes greater than the sum of the valid window sizes of the second and fourth data D2 and D4 may be determined. Also, in the embodiment shown in FIG. 16C, the skew control code for the fourth clock QB has already been set in the second operation. Therefore, similar to the embodiment shown in FIG. 11B, the code value of the skew control code that is set in the second operation of FIG. 16C may be applied as an offset to the skew control code of the fourth clock QB when changing the skew control code of the fourth clock QB in the third operation of FIG. 16C. In addition, as the offset is applied to the skew control code of the fourth clock QB, the skew between the first clock I and the second clock Q may be corrected in a state in which the correction of the skew between the second clock Q and the fourth clock QB is maintained after performing the third operation.

Figure 17:
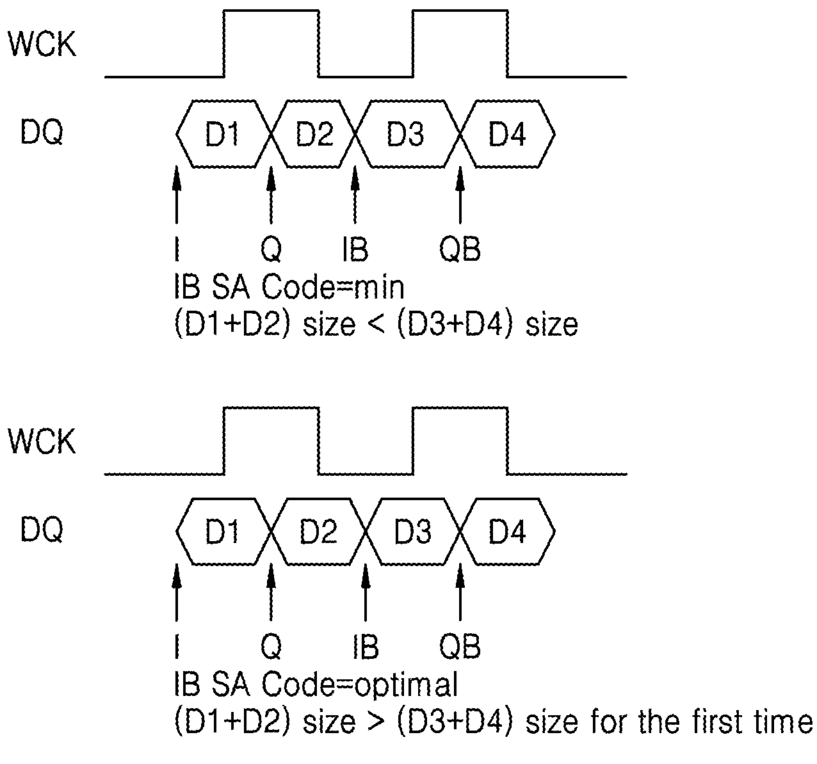

FIG. 17 shows an example of setting skew control code for the third clock shown in FIG. 16A. For example, in a case of the waveform shown in an upper part of FIG. 17, as the skew control code of the third clock IB has the minimum value, the valid window size of the second data D2 is relatively small but the valid window size of the third data D3 is relatively large. Accordingly, the sum of the valid window sizes of the first and second data D1 and D2 is less than the sum of the valid window sizes of the third and fourth data D3 and D4.

On the other hand, in a case of the waveform shown in a lower part of FIG. 17, as the skew control code of the third clock IB gradually increases, there is a point in time when the sum of the valid window sizes of the first and second data D1 and D2 becomes greater than the sum of the valid window sizes of the third and fourth data D3 and D4. This indicates that the code value at that point in time corresponds to the optimal skew control code for the third clock IB. Although not shown in FIG. 17, the remaining second and third operations of the training process for correcting the skews of multi-phase clock signals for each of the data channels may be described in a similar manner to the waveform diagram shown in FIG. 17.

At least one of the components, elements, modules or units described herein may be embodied as various numbers of hardware, software and/or firmware structures that execute respective functions described above, according to an example embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the block diagrams, communication between the components, elements or units may be performed through the bus. Functional aspects of the above example embodiments may be implemented in algorithms that execute on one or more processors. Furthermore, the components, elements or units represented by a block or processing operations may employ any number of related art techniques for electronics configuration, signal processing and/or control, data processing and the like.

Also, the example embodiments have been described as being applied to the memory device, the memory controller communicating with the memory device, or the SoC including the memory controller, but the example embodiments are not necessarily limited thereto. For example, the example embodiments may be applied to other types of semiconductor devices that generate multi-phase clock signals, perform various signal processing using the multi-phase clock signals, and transmit data.

While the disclosure has been particularly shown and described with reference to example embodiments thereof, it will be understood that various changes in form and details may be made therein without departing from the spirit and scope of the following claims and their equivalents.

What is claimed is:

1. A memory controller comprising:

a multi-phase clock generator configured to generate a first clock to an N-th clock having N different phases (where N is an integer equal to or greater than 2);

a write clock generator configured to receive a data pattern and generate, in synchronization with edges of the first to N-th clocks, a monitoring signal having a logic state corresponding to bits of the data pattern during a training process;

a duty adjuster configured to adjust duties of the first to N-th clocks based on pieces of duty control code that are set during the training process;

a skew adjuster configured to adjust a skew of at least one of the first to N-th clocks based on skew control code that is set during the training process; and a training circuit configured to control a training operation for adjusting the duties and at least one skew of the first to N-th clocks, the training operation comprising a plurality of training processes including the training process, wherein, during a first training process of adjusting the duties of the first to N-th clocks, a first monitoring signal to an N-th monitoring signal respectively having waveforms corresponding to the first to N-th clocks are generated using data patterns having different values, and the duties of the first to N-th clocks are adjusted based on a result of monitoring duties of the first to N-th monitoring signals.

2. The memory controller of claim 1, wherein the memory controller is configured to transmit the first to N-th monitoring signals to a memory device and receive duty information representing a result of detecting the duties of the first to N-th monitoring signals from the memory device.

3. The memory controller of claim 1, wherein the duty adjuster comprises first to N-th duty adjusters configured to respectively adjust the duties of the first to N-th clocks, and wherein during the first training process, the duties of the first to N-th monitoring signals are monitored while changing the duties of the first to N-th clocks, and the pieces of duty control code are respectively set for the first to N-th duty adjusters.

4. The memory controller of claim 1, wherein the first to N-th clocks comprise the first clock, a second clock, a third clock, and a fourth clock sequentially having phase differences of 90 degrees, and wherein the data pattern comprises four bits sampled in synchronization with the edges of the first to fourth clocks.

5. The memory controller of claim 4, wherein the first training process comprises a first operation, a second operation, a third operation, and a fourth operation, wherein, during the first operation, the first monitoring signal has a waveform corresponding to the first clock based on a first data pattern with a value of "1100,"

wherein, during the second operation, a second monitoring signal has a waveform corresponding to the second clock based on a second data pattern with a value of "0110,"

wherein, during the third operation, a third monitoring signal has a waveform corresponding to the third clock based on a third data pattern with a value of "0011," and wherein, during the fourth operation, a fourth monitoring signal has a waveform corresponding to the fourth clock based on a fourth data pattern with a value of "1001".

6. The memory controller of claim 4, wherein, during a second training process of adjusting the at least one skew of the first to fourth clocks, the first monitoring signal to a fourth monitoring signal having waveforms corresponding to the first to fourth clocks are generated using the data patterns having different values, and duties of the first to fourth monitoring signals are monitored while changing the at least one skew of the first to fourth clocks.

7. The memory controller of claim 6, wherein the second training process comprises a first operation to a third operation, and wherein the first monitoring signal and a third monitoring signal are generated during the first operation, and a skew between the first clock and the third clock is adjusted based on monitoring duties of the first and third monitoring signals while changing a skew of any one of the first and third clocks.

8. The memory controller of claim 7, wherein a second monitoring signal and the fourth monitoring signal are generated during a second operation, and a skew between the second clock and the fourth clock is adjusted based on monitoring duties of the second and fourth monitoring signals while changing a skew of any one of the second and fourth clocks.

9. The memory controller of claim 8, wherein, during the third operation, a fifth monitoring signal having a frequency twice that of each of the first to fourth clocks is further generated, and wherein a skew between the first clock and the second clock is adjusted based on monitoring a duty of the fifth monitoring signal while changing a skew of the second clock.

10. The memory controller of claim 1, further comprising:

a serializer configured to sequentially output first to N-th data to be transmitted to a memory device in synchronization with the first to N-th clocks; and a data duty adjuster configured to adjust duties of the first to N-th data based on a duty control code set for the data duty adjuster, wherein, during a second training process of adjusting the duties of the first to N-th data, the first to N-th data are written in the memory device while changing the duties of the first to N-th data, and the first to N-th data output from the memory device are sampled in synchronization with a write clock generated by the write clock generator, and wherein a valid window size of even data synchronized with a rising edge of the write clock among the sampled first to N-th data and a valid window size of odd data synchronized with a falling edge of the write clock among the sampled first to N-th data are determined.

11. The memory controller of claim 10, wherein, during a first operation in the second training process, the even data has a value corresponding to a logic high level and the odd data has a value corresponding to a logic low level, and wherein first duty control code is obtained corresponding to a point in time when the valid window size of the even data becomes greater than the valid window size of the odd data.

12. The memory controller of claim 11, wherein, during a second operation in the second training process, the even data has a value corresponding to a logic low level and the odd data has a value corresponding to a logic high level, wherein second duty control code obtained corresponding to a point in time when the valid window size of the odd data becomes greater than the valid window size of the even data, and wherein the duty control code set for the data duty adjuster corresponds to an average value of the first duty control code and the second duty control code.

13. A method of operating a memory controller, the method comprising:

generating a first clock, a second clock, a third clock, and a fourth clock having phase differences of 90 degrees therebetween;

receiving data patterns having bits of different values, and generating monitoring signals corresponding to waveforms of the first to fourth clocks by respectively sampling the bits of different values of the data patterns, wherein a logic state of each monitoring signal transitions in synchronization with an edge of a corresponding one of the first to fourth clocks;

transmitting the monitoring signals to a memory device;

receiving, from the memory device, duty information representing a result of monitoring duties of the monitoring signals; and adjusting duties of the first to fourth clocks based on the duty information.

14. The method of claim 13, wherein the adjusting the duties of the first to fourth clocks comprises performing a training process of adjusting the duties of the first to fourth clocks comprises a first operation, a second operation, a third operation, and a fourth operation, wherein, during the first operation, a first monitoring signal having a waveform corresponding to the first clock is generated based on a data pattern having a first value, and a duty of the first clock is adjusted according to a result of monitoring a duty of the first monitoring signal, wherein, during the second operation, a second monitoring signal having a waveform corresponding to the second clock is generated based on a data pattern having a second value, and a duty of the second clock is adjusted according to a result of monitoring a duty of the second monitoring signal, wherein, during the third operation, a third monitoring signal having a waveform corresponding to the third clock is generated based on a data pattern having a third value, and a duty of the third clock is adjusted according to a result of monitoring a duty of the third monitoring signal, and wherein, during the fourth operation, a fourth monitoring signal having a waveform corresponding to the fourth clock is generated based on a data pattern having a fourth value, and a duty of the fourth clock is adjusted according to a result of monitoring a duty of the fourth monitoring signal.

15. The method of claim 13, wherein the adjusting the duties of the first to fourth clocks comprises performing a training process of adjusting the duties of the first to fourth clocks, the training process comprises monitoring the duties of the monitoring signals while changing the duties of the first to fourth clocks, and wherein, for a corresponding one of the first to fourth clocks, a code value at a point in time when a value of duty information of a corresponding monitoring signal changes is set as duty control code for adjusting a duty of the corresponding one of the first to fourth clocks, the duty information being based on ratio of a size of a logic high section to a size of a logic low section of the corresponding monitoring signal.

16. The method of claim 13, further comprising performing a training process of adjusting a skew of at least one of the first to fourth clocks, wherein a first operation in the training process of adjusting the skew comprises monitoring duties of a first monitoring signal and a third monitoring signal having waveforms corresponding to the first and third clocks while changing a skew of the third clock and comprises setting skew control code of the third clock based on a result of monitoring the duties of the first and third monitoring signals, and wherein a second operation in the training process of adjusting the skew comprises monitoring duties of a second monitoring signal and a fourth monitoring signal having waveforms corresponding to the second and fourth clocks while changing a skew of the fourth clock and comprises setting skew control code of the fourth clock based on a result of monitoring the duties of the second and fourth monitoring signals.

17. The method of claim 16, further comprising generating a fifth monitoring signal having a frequency twice that of each of the first to fourth clocks, wherein a third operation of the training process of adjusting the skew comprises setting skew control code of the second clock based on a result of monitoring a duty of the fifth monitoring signal while changing a skew of the second clock.

18. The method of claim 13, further comprising performing a training process of adjusting duties of data provided to the memory device, wherein the training process of adjusting the duties of the data comprises writing first data, second data, third data, and fourth data in the memory device while changing the duties of the data and comprises sampling the first to fourth data output from the memory device in synchronization with a write clock having a frequency twice that of each of the first to fourth clocks, and wherein the duties of the data are adjusted based on a comparison result between a valid window size of even data synchronized with a rising edge of the write clock among the sampled first to fourth data and a valid window size of odd data synchronized with a falling edge of the write clock among the sampled first to fourth data.

19. A method of operating a memory controller, the method comprising:

generating a first clock to an N-th clock having phase differences of 90 degrees therebetween (where N is an integer equal to or greater than 2);

generating a first monitoring signal to an N-th monitoring signal corresponding to waveforms of the first to N-th clocks, based on the first to N-th clocks and data patterns;

adjusting a duty of each of the first to N-th clocks, based on a result of monitoring duties of the first to N-th monitoring signals while changing the duties of the first to N-th clocks in a training process;

adjusting a skew of at least one of the first to N-th clocks, based on a result of monitoring the duties of the first to N-th monitoring signals while changing the skew of at least one of the first to N-th clocks in the training process;

writing first to N-th data in a memory device, while changing duties of the data, and receiving the first to N-th data from the memory device in synchronization with a write clock having a frequency twice that of each of the first to N-th clocks; and adjusting the duties of the data based on a comparison result between a valid window size of data received in synchronization with a rising edge of the write clock and a valid window size of data received in synchronization with a falling edge of the write clock.

20. The method of claim 19, wherein the memory controller comprises a serializer configured to sequentially output the first to N-th data in synchronization with the first to N-th clocks and a skew adjuster arranged corresponding to the serializer and configured to adjust the skew of the at least one of the first to N-th clocks provided to the serializer, and the method further comprises:

writing the first to N-th data in the memory device, while changing the skew of the at least one of the first to N-th clocks, and receiving the first to N-th data from the memory device in synchronization with the write clock; and setting skew control code for the skew adjuster based on a comparison result between the valid window sizes of the received first to N-th data.

* * * * *